(12) United States Patent  
Sakaguchi

(10) Patent No.: US 6,514,649 B1  
(45) Date of Patent: Feb. 4, 2003

(54) ORGANIC EL PANEL AND METHOD FOR FORMING THE SAME

(75) Inventor: Yoshikazu Sakaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/411,973

(22) Filed: Oct. 4, 1999

(30) Foreign Application Priority Data

Oct. 5, 1998 (JP) ............................................. 10-282666

(51) Int. Cl.$^7$ ........................ G03G 13/01; G03G 13/14
(52) U.S. Cl. ............................ 430/47; 430/54; 430/45; 430/46; 430/100; 430/103; 430/7; 430/126
(58) Field of Search ........................... 430/47, 54, 100, 430/103, 126, 7, 45, 46; 313/507

(56) References Cited

U.S. PATENT DOCUMENTS 6,303,255 B1 * 10/2001 Sakaguchi et al. ............ 430/97

FOREIGN PATENT DOCUMENTS

| JP | 63-295695 | 12/1988 |
| JP | 1-197994 | 8/1989 |
| JP | 3-72368 | 3/1991 |
| JP | 5-108014 | 4/1993 |
| JP | 5-34506 | 12/1993 |
| JP | 6-13184 | 1/1994 |
| JP | 7-121056 | 5/1995 |
| JP | 11-126687 | 5/1999 |

* cited by examiner

*Primary Examiner*—Christopher Rodee
(74) *Attorney, Agent, or Firm*—Katten Muchin Zavis Rosenman

(57) ABSTRACT

In a method of manufacturing and organic EL panel wherein an organic light emitting material is laminated between a pair of opposing electrodes, at least one of which is transparent or semitransparent, a photosensitive body having a charge generating layer 3 and charge transfer layer 4 is formed on the transparent substrate 2 side, and a latent image is formed by charging and exposing this photosensitive body. Using a powder developer, the exposed portion or unexposed portion thereof is developed, and a separation wall composed of the charged powder developer is formed. Next, a light emitting layer, electron transporting layer, and cathode are uniformly deposited by in vacuo vapor deposition, and after vapor deposition, by removing the developer used in the separation wall by transfer, the laminate of the light emitting layer, electron transporting layer, and cathode is selectively removed therewith, light emitting pattern formation and cathode separation are performed, and pixels are formed.

18 Claims, 8 Drawing Sheets

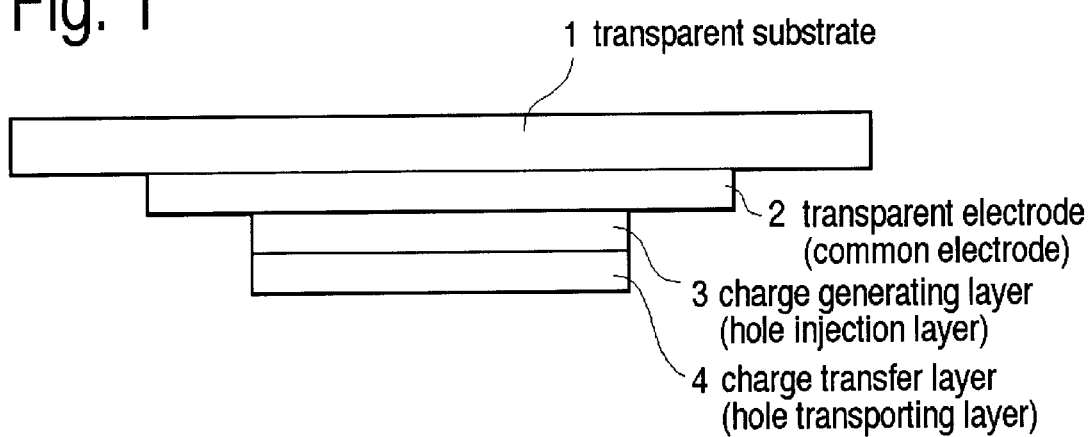
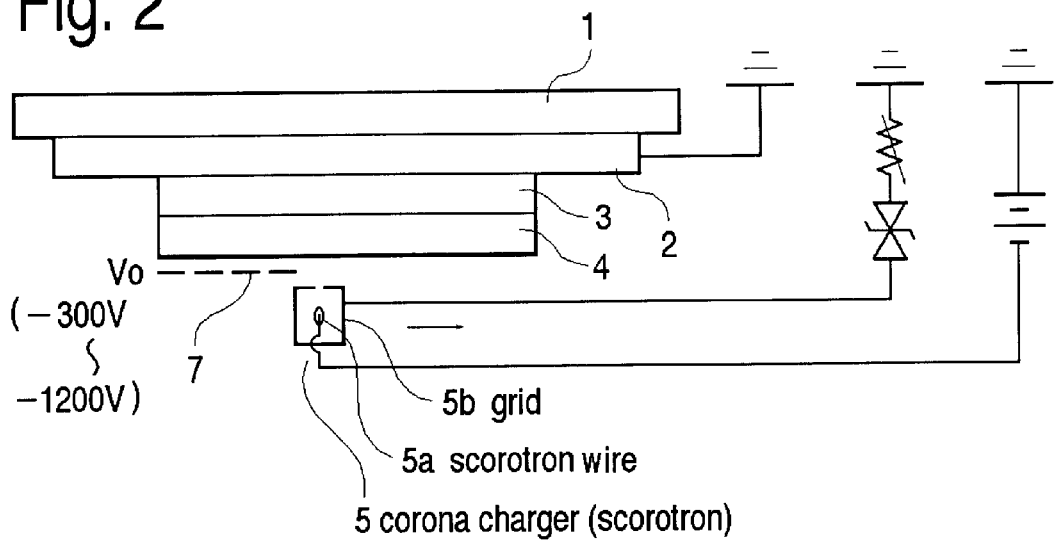
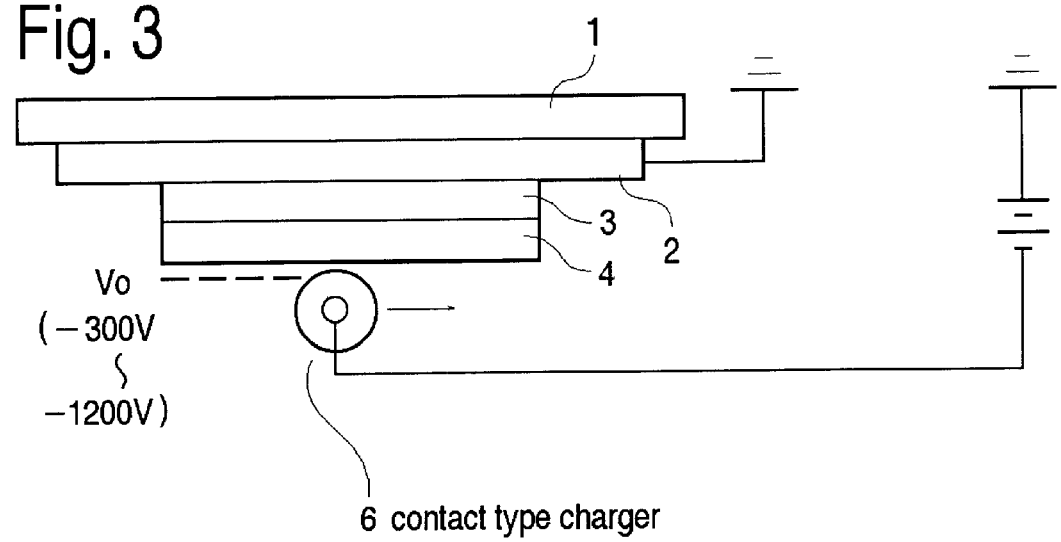

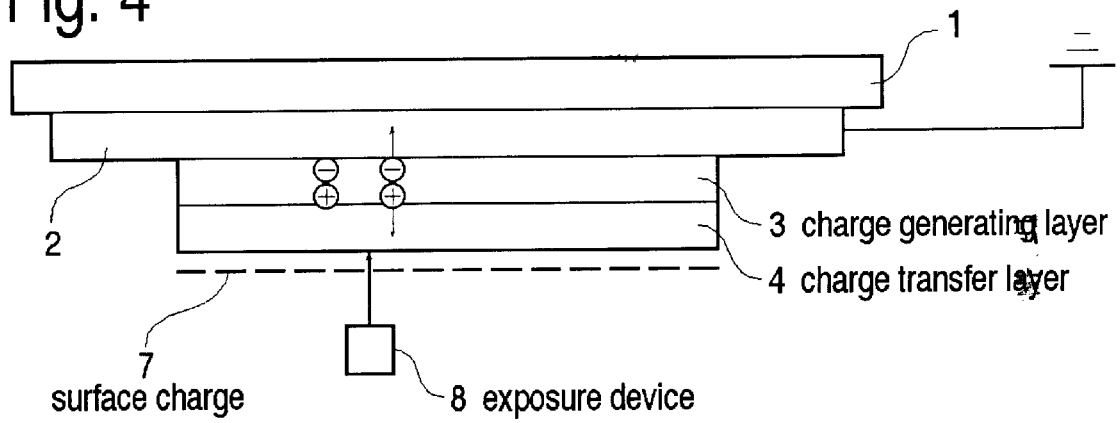
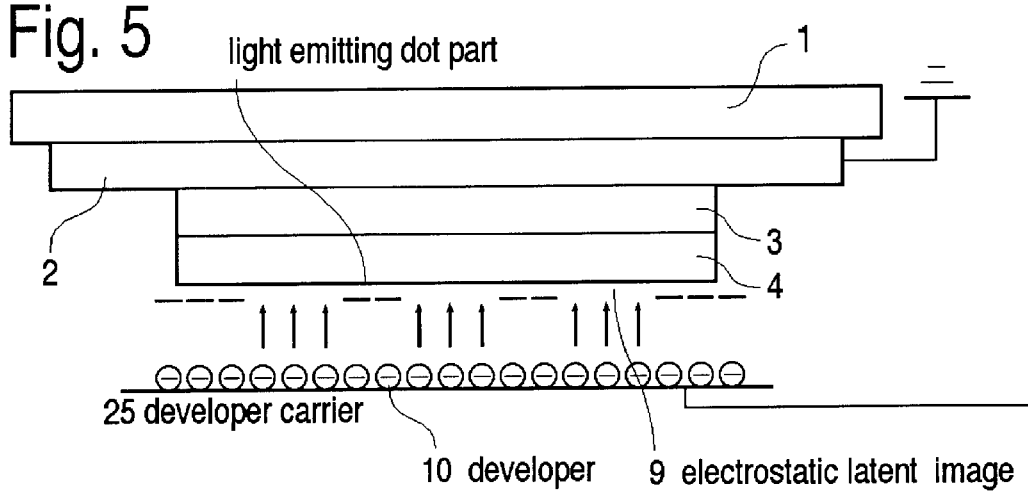
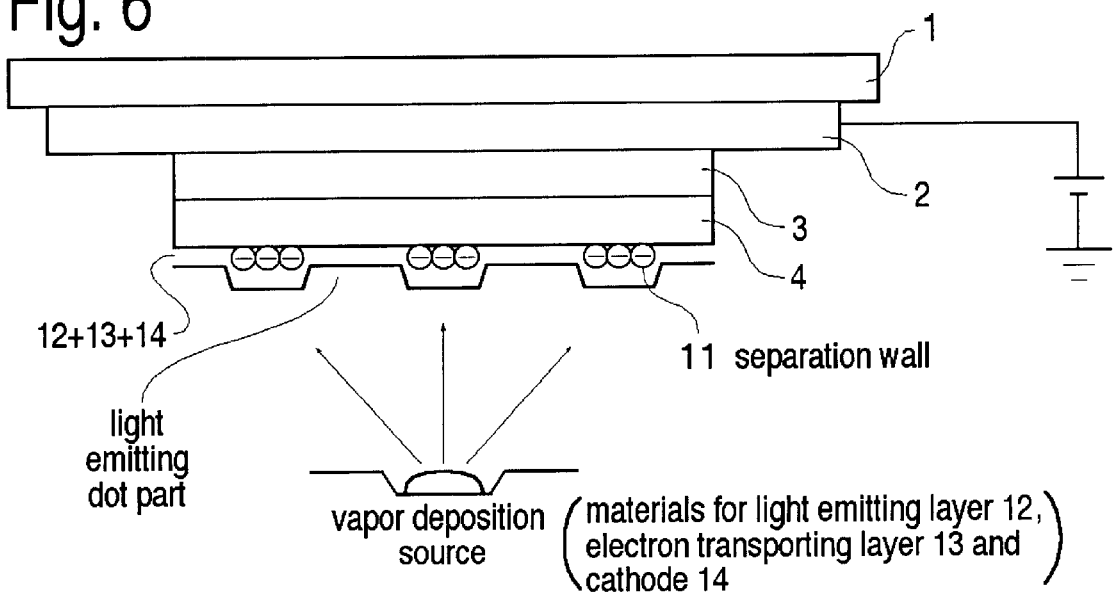

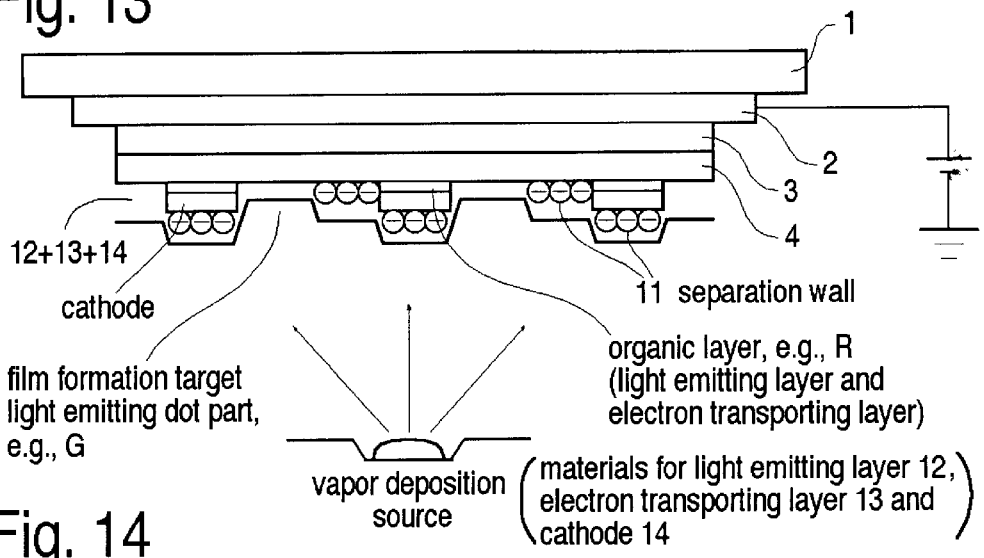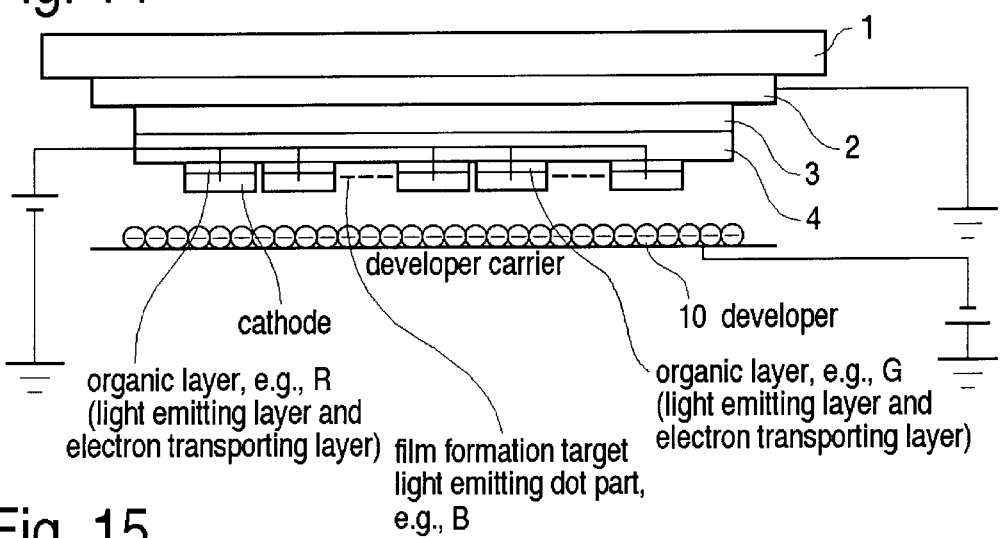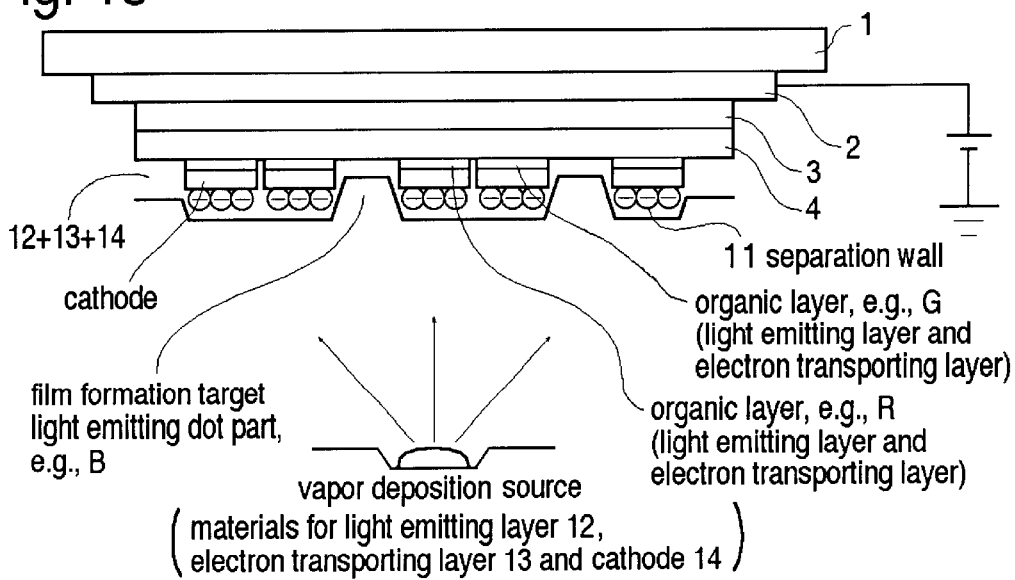

ORGANIC EL PANEL AND METHOD FOR FORMING THE SAME

BACKGROUND OF THE INVENTION

The present invention relates to a method of manufacturing an organic electroluminescent panel, particularly, a method of forming pixels and a color separation method in an organic electroluminescent panel. In the present specification the term "electroluminescence" [electroluminescent] will be abbreviated as "EL".

A method of manufacturing an inorganic EL panel is disclosed in Japanese Unexamined Patent Application Publication No. 5-108014. In this inorganic EL panel manufacturing method, as shown in FIG. 22, the process whereby a mask plate 19 having a window pattern 19A corresponding to the light emitting film part for pixels of an identical display color is arranged in extreme proximity to the panel substrate (wherein a transparent electrode 2 and insulating layer 17 are laminated on a transparent electrode 1), and in this state, an inorganic light emitting layer 18 of the identical display color is formed into a film selectively and uniformly from a vapor deposition source 20 in a position corresponding to the window pattern 19A on the insulating layer 17, is performed in sequence, while the position of the mask plate 19 is shifted for each color, then light emitting film parts having differing display colors are formed in sequence by shifting the position for each color. This method is referred to hereinafter as the first conventional method.

Additionally, Japanese Unexamined Patent Application Publication No. 7-121056 discloses a manufacturing method for a color filter used in plasma display or liquid crystal display. According to this method, after a substrate on which a photosensitive layer having an organic photoconductive layer is formed has been charged to the desired polarity, and an electrostatic latent image has been formed by selective exposure, a pattern is formed by fixing a developer in which an inorganic pigment is dispersed, said substrate is baked, the organic photoconductive layer is removed, and the desired pattern can be obtained. Hereinafter, this method is referred to as the second conventional method.

Furthermore, pigment dispersion methods which use photolithography can be considered as manufacturing methods for color filters for liquid crystal displays. In such a method, after the substrate has been coated with a photosensitive polymer in which the colorizing pigment has been dispersed, it is exposed through a photomask and then developed, a color pattern is formed by etching, and this process is repeated for each color of red, green, and blue. This method is referred to hereinafter as method of the comparative example.

For reasons such as the occurrence of bending or warping of the mask plate caused by the weight of the mask plate itself or thermal expansion due to radiant heat during vapor deposition and the difficulty in controlling the precise position of the mask plate, problems such as the overlapping of layers and insufficient separation occur. For this reason, this method is defective in terms of difficulty in increasing the screen size from the standpoint of yield. Additionally, the mask plate is formed by opening patterns in a thin metal plate by etching, but the finer the pattern becomes, the more easily the plate can be cut, and the more difficult the manufacture of the mask plate itself becomes. Furthermore, it is necessary to separate the mask plate and substrate as a countermeasure against shorts in the pixels caused by scratches occurring when the mask plate and substrate come in contact, but the vapor deposition material can turn in on itself during vapor deposition, so that there are limitations to refinement.

The second conventional method, whereby an electrostatic latent image on the photosensitive body is developed with an inorganic pigment dispersed developer, then baked, and the photosensitive body is removed, uses an organic material which lacks heat resistance as the light emitting layer, charge transfer layer, etc., and therefore cannot be used in organic EL panels. In the organic EL panel, moreover, since at present there are no white light emitting materials, the use of a color filter is difficult.

Furthermore, in the case of the method of the comparative example, whereby a pigment dispersion system is used in the coloration of an organic EL panel, since the organic EL material is extremely susceptible to moisture, in patterning, after the substrate which has been coated with the organic polymer has been exposed through a photomask, when processes such as developing and etching are performed, pixel defects such as the occurrence and growth of dark spots and exfoliation at the interface between the organic layer and the electrode can easily occur.

Thus, heretofore, there has been no method for manufacturing organic EL panels in which refinement and/or coloration can be realized practically and effectively.

SUMMARY OF THE INVENTION

An object of the present invention is to offer a method of manufacturing an organic thin-film EL panel in which the problems described above are solved.

A second object of the present invention is to offer a method of manufacturing an organic thin-film EL panel in which refinement and coloration can be achieved by means of a simple method without damaging pixels in the organic EL panel.

In order to achieve the aforementioned purpose, the manufacturing method of the present invention is characterized by the fact that, in the manufacture of a pixel light emitting layer and pixel electrode formed in an organic EL panel wherein an organic light emitting material is laminated between a pair of opposing electrodes, at least one of which is transparent or semitransparent:

- a transparent substrate is prepared wherein a transparent or semitransparent common electrode is formed on at least one face thereof;
- a photosensitive thin film having a charge generating layer and charge transfer layer is formed on the aforementioned common electrode;
- the aforementioned photosensitive thin film is uniformly charged, and an electrostatic image is formed by exposure in a specified pattern;
- the unexposed portions and the exposed portions of the aforementioned photosensitive thin-film are developed using a powder developer, and a separation wall is formed from the aforementioned charged power developer
- a light emitting layer, electron transporting layer, and pixel electrode layer are uniformly deposited in that order;
- after deposition, using the charge of the aforementioned electrostatic latent image, the aforementioned power developer used in the aforesaid separation wall is removed by transfer, and the laminate is selectively removed together therewith;
- pattern formation of the pixel light emitting layer and separation of the pixel electrode layer are performed simultaneously, and a pixel light emitting layer and pixel electrode are formed in a specified pixel pattern.

Furthermore, according to the second characteristic of the present invention, the method whereby a pixel light emitting layer for each color and pixel electrodes are formed so as to be separated from one another in a color organic EL panel wherein an organic light emitting material is layered between a pair of opposing electrodes, at least one of which is transparent or semitransparent, is characterized by the fact that:

a transparent substrate is prepared wherein a transparent or semitransparent common electrode is formed on at least one face thereof;

a photosensitive thin film having a charge generating layer and charge transfer layer is formed on the aforementioned common electrode;

the aforesaid photosensitive thin film is uniformly charged, an electrostatic latent image is formed by exposure in a pattern in a first color among the three colors of red, green, and blue;

the exposed portion or the unexposed portion of the aforementioned photosensitive film is developed using a powder developer, and a first mask, which is composed of the aforementioned powder developer that has been charged and covers the regions other than the pixel region of the aforementioned first color, is formed;

a light emitting layer of the aforementioned first color, an electron transporting layer, and a pixel electrode layer are deposited uniformly in that order;

after deposition, the aforementioned powder developer used in the aforementioned first mask is removed using the charge of the electrostatic latent image, the laminate is selectively removed together therewith, and a pixel light emitting layer and pixel electrode of a pixel pattern of the aforementioned first color are formed;

the aforesaid photosensitive thin film is uniformly charged, an electrostatic latent image is formed by exposure in a pattern in a second color among the three colors of red, green, and blue;

the exposed portion or the unexposed portion of the aforementioned photosensitive film is developed using a powder developer, and a second mask, which is composed of the aforementioned powder developer that has been charged and covers the regions other than the pixel region of the aforementioned second color, is formed;

a light emitting layer of the aforementioned second color, an electron transporting layer, and a pixel electrode layer are deposited uniformly in that order;

after deposition, the aforementioned powder developer used in the aforementioned second mask is removed using the charge of the electrostatic latent image, the laminate is selectively removed together therewith, and a pixel light emitting layer and pixel electrode of a pixel pattern of the aforementioned second color are formed;

the aforesaid photosensitive thin film is uniformly charged, an electrostatic latent image is formed by exposure in a pattern in a third color among the three colors of red, green, and blue;

the exposed portion or the unexposed portion of the aforementioned photosensitive film is developed using a powder developer, and a third mask, which is composed of the aforementioned powder developer that has been charged and covers the regions other than the pixel region of the aforementioned third color, is formed;

a light emitting layer of the aforementioned third color, an electron transporting layer, and a pixel electrode layer are deposited uniformly in that order;

after deposition, the aforementioned powder developer used in the aforementioned third mask is removed using the charge of the electrostatic latent image, the laminate is selectively removed together therewith, and a pixel light emitting layer and pixel electrode of a pixel pattern of the aforementioned third color are formed;

a pixel light emitting layer and pixel electrode are formed in the three colors of red, green, and blue in the respective desired pixel patterns.

By means of the method of manufacturing an organic EL panel according to the present invention, the organic photosensitive body is formed on a transparent or semitransparent common electrode which is formed as a glass or other transparent substrate, and after this organic photosensitive body has been charged, and an electrostatic image has been formed by selective exposure in a specified pattern, an electrostatic latent image is formed in areas other than those parts, the aforementioned electrostatic latent image is developed using a powder developer having a specified granule diameter and charge amount, and a pixel separation wall is formed.

Furthermore, by means of the method of manufacturing a color organic EL panel according to the present invention, an organic photosensitive body that has been formed on the transparent electrode side for each color is charged and exposed, an electrostatic latent image in the areas other than those of the light emitting dots of the color in question is formed (i.e., an area equivalent to the dot width and space of two colors), and using a developer, a tight-fitting mask is formed in the exposed areas.

Finally, by forming uniformly a light emitting layer for that color, an electron transporting layer, and a pixel electrode layer in that order, by, e.g., vapor deposition, and removing the developer that has formed the tight-fitting mask or separation wall from the panel substrate, a process is performed whereby light emitting pixels and pixel electrodes for that color are formed.

The dot pitch and space width of the organic EL panel obtained is determined by the exposure precision and the granule size of the developer, and it is possible to form a fine pattern having a size of about 10 $\mu$.

According to the method described above, moreover, since there is no curling in during vapor deposition due to the floating of the mask when a thin film is formed by vacuum vapor deposition using a mask plate that is separated from the substrate, as in the first conventional method described above, there is no color displacement or positional displacement, and a panel having sharp edges can be produced. Since there is no necessity to position the mask or to reduce the vacuum processing, the panel manufacturing process can be accelerated.

BRIEF EXPLANATION THE DRAWINGS

FIG. 1 is a sectional view showing the state in which the transparent electrode and organic photosensitive thin film are formed on a transparent substrate in a method of manufacturing an organic EL panel in a working example of the present invention.

FIG. 2 is a sectional view explaining the first method whereby a photosensitive thin film is uniformly charged in a method of manufacturing an organic EL panel in a working example of the present invention.

FIG. 3 is a sectional view explaining the first method whereby a photosensitive thin film is uniformly charged in a method of manufacturing an organic EL panel in a working example of the present invention.

FIG. 4 is a sectional view explaining the state in which the photosensitive thin film is exposed in a method of manufacturing an organic EL panel in a working example of the present invention.

FIG. 5 is a sectional view explaining the developing method in the first mode of a method of manufacturing an organic EL panel in a working example the present invention.

FIG. 6 is a sectional view explaining the method of forming a laminate of a light emitting layer, electron transporting layer, and cathode in the first mode of a method of manufacturing an organic EL panel in a working example of the present invention.

FIG. 13 is a sectional view explaining the method of removing a laminate of a light emitting layer, electron transporting layer, and cathode for the second color in the third mode of a method of manufacturing an organic EL panel in a working example of the present invention.

FIG. 14 is a sectional view explaining the method of developing a latent image for the third color in the third mode of a method of manufacturing an organic EL panel in a working example of the present invention.

FIG. 15 is a sectional view explaining the method of removing a laminate of a light emitting layer, electron transporting layer, and cathode for the third color in the third mode of a method of manufacturing an organic EL panel in a working example of the present invention.

DETAILED DESCRIPTION OF THE INVENTION

Figure 7:
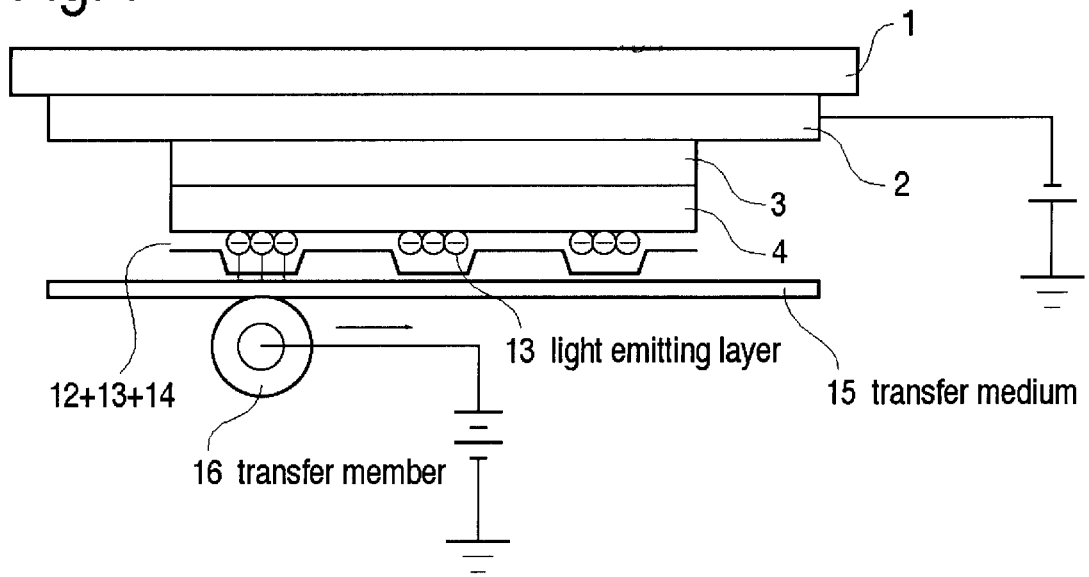
FIG. 7 is a sectional view explaining the method of forming a laminate of a light emitting layer, electron transporting layer, and cathode in the first mode of a method of manufacturing an organic EL panel in a working example of the present invention.

Next, the present invention is explained referring to the figures. First, as shown in FIG. 1, a transparent common electrode 2 made of, e.g., indium tin oxide (ITO), tin oxide thin film, etc., is formed on a transparent substrate 1 of glass or light material. The common electrode 2 may also be semitransparent. The thin film formation method whereby the common electrode 2 is formed may use a sputtering method, electron beam method, chemical reaction method, or the like.

An organic photosensitive layer composed of an organic charge generating layer 3 and an organic charge transfer layer 4 is formed on the transparent electrode 2. The organic charge generating layer 3 may be formed using a coating liquid in which an organic charge generating agent is dispersed in butyral resin, for example. Examples of organic charge generating agents include phthalocyanine compounds such as nonmetallic phthalocyanines, copper phthalocyanine, titanyl phthalocyanine, and vanadyl phthalocyanine, perylene type pigments, polycyclic quinone type pigments, squarylinium pigments, and azulenium pigments. The organic charge generating layer 3 preferably should be formed in a thickness of 0.04 $\mu$m.

The organic charge transfer layer 4 can be formed as a film using a coating liquid wherein a hole transporting organic compound is dispersed in, for example, a polycarbonate resin. Such hole transporting organic compounds include amine derivatives such as N,N'-diphenyl-N,N'-di(3-methylphenyl)-1,1'-biphenyl-4,4'-diamine (abbreviated as TPD) and N,N'-diphenyl-N,N'-bis($\alpha$-naphthyl)-1,1'-biphenyl-4,4'-diamine (abbreviated as $\alpha$-NPD), aryl amine derivatives such as 4,4',4"-tris(3-methylphenethylphenethylamino)-triphenylamine, heterocyclic compounds such as oxadiazole, oxazole and pyrazoline, hydrazone type compounds, condensed polycyclic compounds, etc. The organic charge transfer layer 4 also should be formed in a thickness of 0.04 $\mu$m.

The thin film formation method of the charge generating layer 3 and charge transfer layer 4 may use either a dipping method or spin coating method. The film thickness of the organic photosensitive layer composed of the charge generating layer 3 and charge transfer layer 4 should be as thin as possible, taking into consideration the degree of movement of carriers and the fact that light is extracted from the glass substrate side. However, if the film is too thin, insulation breakdown can occur due to pin holes, etc. On the other hand, if the organic photosensitive layer is too thick, then the drive voltage necessary for the completed organic EL panel will be too high, so a maximum of 25 μm is desirable. From overall considerations, a range of about 0.1 to 5 μm is preferable for the film thickness of organic photosensitive layer. The ratio of film thickness between the charge generating layer 3 and charge transfer layer 4 should be in a range from 1:1 to 1:20.

Since this process can be performed in various modes, an explanation is given for each mode.

First Mode

An organic photosensitive layer formed on a substrate is electrostatically charged, as shown in FIG. 2, using a corona charger 5 such as a scorotron having a scorotron wire 5a and grid 5b, or, as shown in FIG. 3, using a contact type charger such as a brush charger 6, blade charger, or roller charger. The photosensitive body charge potential V0, when the transparent electrode 2 is given a ground potential, changes according to the film thickness and migration properties of the organic film that is formed, but when reversal development is performed using a negatively charged developer, this becomes approximately −300 to −1200 V. For this reason, in the case of a scorotron, since discharge development is performed, the voltage applied to the scorotron wire 5a is in a range from 2 kV to several kV. On the other hand, in the case of a contact type developer, since there is contact resistance between the brush, blade, or roller and the photosensitive layer, a voltage approximately 100 to 300 V higher than the photosensitive body charged voltage V0 (approximately −400 to −1500 V) is applied to the contact charger.

Next, as shown in FIG. 4, in the case of reverse development, using an exposure device 8 such as a laser or LED, pattern exposure is performed by selective scanning of the areas other than the light emitting area that is the target of vapor deposition, or uniform exposure is performed via a photomask forming a pattern on the areas other than the light emitting area that is the target of vapor deposition. In other words, the charged photosensitive body is exposed in an inverted pattern of the dot pattern of the pixel light emitting layer to be formed. At this time, the transparent electrode 2 is connected to a ground potential.

The wavelength of the exposure device is about 780 nm, which is the absorption wavelength of the charge generating layer. At this time, light such as a laser beam reaches the charge generating layer, hole-electrode pairs are generated, these holes and electrodes are separated, electrons escape to the ground via the transparent electrode 2, while holes are injected into the charge transfer layer by means of an electric field based on the charge potential V0 of the photosensitive body surface, and travel until reaching the photosensitive body surface. The holes reaching the surface bond with the electrostatic charges, reducing the electrostatic charge, and thereby forming an electrostatic latent image 9 having an exposure voltage Vi, as shown in FIG. 5.

In order to form a comparatively unrefined pattern on a substrate having a large surface area, uniform exposure by LED using a photomask is efficient, but in order to form a finer, more complex pattern, a laser scanning exposure method is more effective.

Next, the transparent electrode 2 is maintained at ground potential, and the electrostatic latent image is developed using the developer 10. A pulverized developer obtained by kneading a charge control agent (CCA) into a polymer selected from among polyesters, styrene-acrylic copolymers, and acrylics, and pulverized to a suitable granule size, or a polymerized developer, produced by incorporating a charge control agent (CCA) when the aforesaid polymer is polymerized and inducing polymerization to a suitable granule size, may be used as the developer 10. A nigrosine dye or quaternary ammonium salt, etc., may be used as a positive-charging charge control agent. An electronic-receptive substance such as a metal salt of a monoazo dye can be used as a negative-charging charge control agent.

Figure 21:
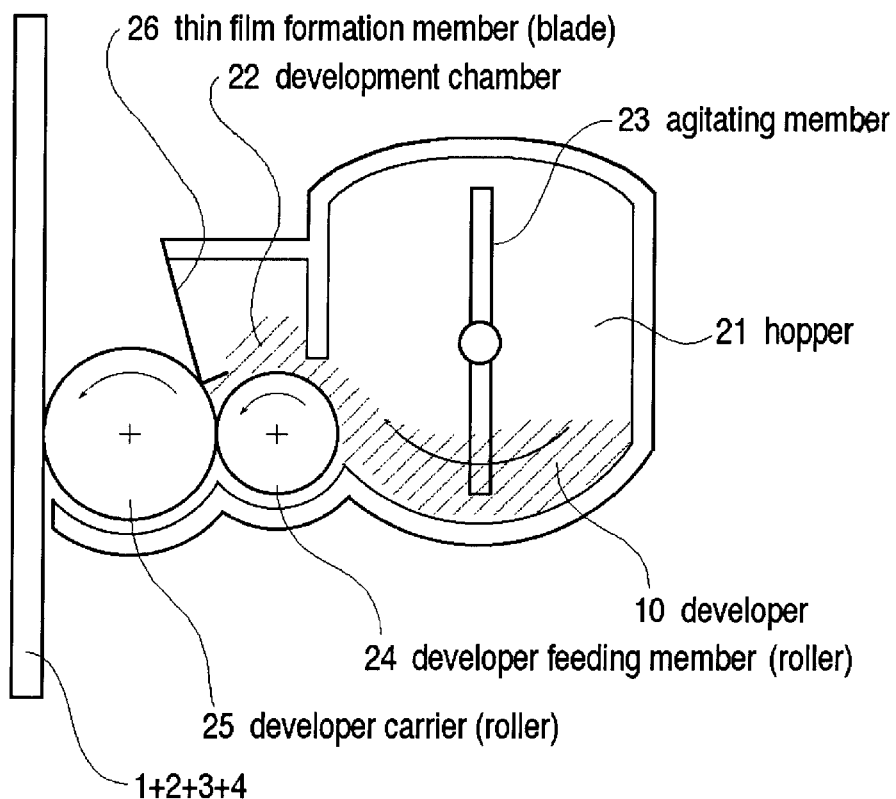
FIG. 21 is a sectional view of a developing machine used in the method of manufacturing an organic EL pattern in a working example of the present invention.
Figure 22:
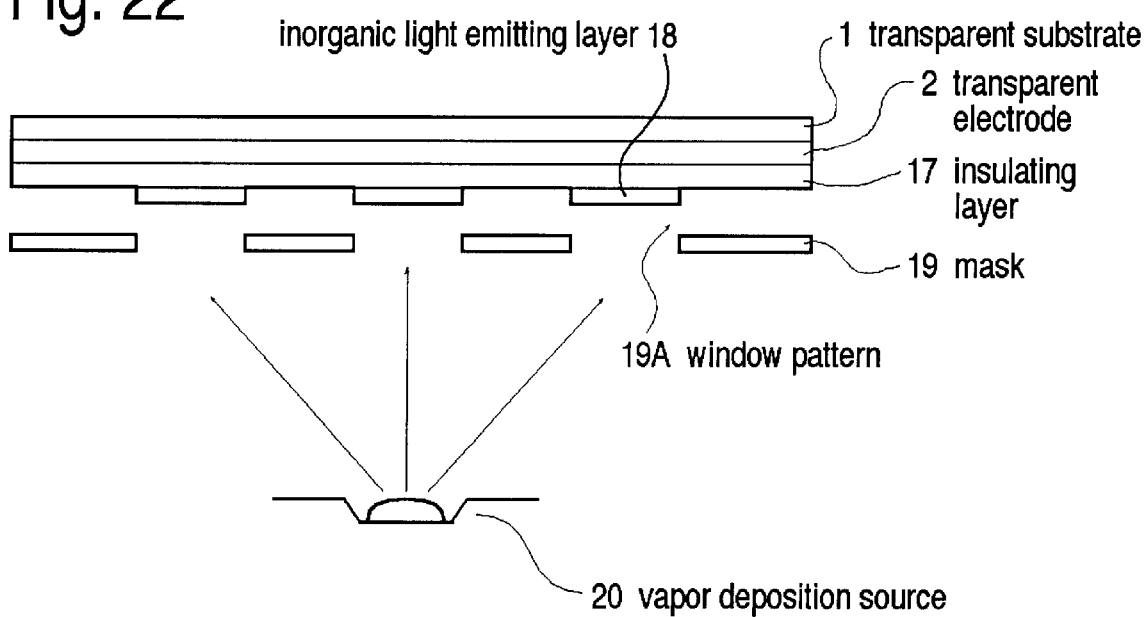
FIG. 22 is a sectional view explaining a conventional inorganic EL panel manufacturing process.

The developing device for uniformly charging the developer and developing the electrostatic latent image may be constituted, for example, as shown in FIG. 21. Specifically, the developing device shown in the figure has a hopper 21, which holds the developer 10, and a developing chamber 22, which charges the developer 10 and supplies it to the photosensitive layer on which the electrostatic latent image is formed.

The developer 10 inside the hopper 21 is agitated by means of an agitating member 23, and is supplied to the developer carrier 25, which comprises a roller which rotates in the counter-clockwise direction in the figure, by means of a developer feeding member 24, which comprises a roller which is driven in rotation likewise in the counter-clockwise direction in the figure. The developer carrier 25 is composed of a metal roller made of stainless-steel, aluminum, or the like, and an elastic rubber material such as silicone, nitrile-butadiene copolymer, or urethane rubber which is provided with conductivity by means of ketjen black or acetylene black, formed on the outer circumference of said metal roller. The elastic part of the surface of this developer carrier 25, in consideration of the contact pressure with the thin-layer formation member 26 formed by the doctor plate, has a rubber hardness of 30 to 40 degrees, based on JIS hardness meter A, and in consideration of leakage into the electrostatic latent image carrier due to the low resistance of the developer carrier, and reduction in the development efficiency, clouding, etc., due to high resistance thereof, the resistance between the roller surface and core should be made within $10^5$ to $10^6$ Ω so as to obtain the optimal development efficiency. Moreover, in order to uniformly charge and convey the developer having a granule size of about 6 μm, which is used in the working example described below, the cross-point average surface roughness Rz of the developer carrier should be no greater than 10 μm.

The developer 10 supplied to the developer carrier 25 is charged by friction with a thin-layer formation member 26, its thickness is restricted, and it forms a uniform thin layer approximately several layers from the developer 1 layer.

The thin-layer formation member 26 is composed of a spring material such as a thin metal plate of stainless steel, phosphor bronze, or like material. The charge developer which forms a thin layer on the developer carrier is carried up to the area of opposition between the developer carrier and the photosensitive body under rotation of the developer carrier, and, by means of an electric field based on the potential differences among the electrostatic potential V0 of photosensitive body surface, the exposure potential Vi, and the development bias Vb applied to the developer carrier, is transferred to the electrostatic latent image on the photosensitive body surface and forms an image (FIG. 5). The developer carrier and organic photosensitive body may be placed in contact with each other or, if placed in proximity but separated, since the developer can fly onto the photosensitive body due to the electrical field, should be separated by a distance of 100 to 300 μm. By performing non-contact development, fogging and scattering onto non-developed areas can be reduced.

The development shown in FIG. 5 is a reversal development method in which the photosensitive body potential and the charging polarity of the developer are the same polarity. In the latent image shown in FIG. 5 formed by exposure in a reverse pattern of the dot pattern of the pixels, the exposure potential Vi is distributed on the reverse pattern, and the electrostatic potential V0 (negative potential) is distributed on the pixel dot pattern. When such an electrostatic latent image is developed using a negatively charged developer 10, the negatively charged developer 10 does not adhere to the dot pattern parts of the pixels having an electrostatic potential of V0 (negative potential), but adheres only to the reverse pattern part having the exposure potential of Vi.

There are two methods which can be used as a developing process: reversal development wherein, as shown in FIG. 5, the photosensitive body potential and the charge polarity of the developer have the same polarity, and positive development, as described below, wherein the photosensitive body potential and the charge of the developer have opposite polarities. The positive development method is effective in the development of a comparatively large region, and the reversal development method is useful in the development of finer regions.

By developing the electrostatic latent image using the developing device, as shown in FIG. 6, a separation wall 11, which separates the light emitting dots, is formed by the adhering developer.

Next, as shown in FIG. 6, a light emitting layer 12 is formed by means of, e.g., vacuum vapor deposition, wherein the transparent electrode 2 is given a positive potential.

In order to form a green or red light emitting layer 12, vapor codeposition of a dopant for green or red is performed using an 8-hydroxyquinoline metal complex represented by tris(8-quinolol)ammonium (aluminoquinoline complex), a distyrylbenzene derivative such as 1,4-bis(2-methylstyryl) benzene, a bisstyrylanthracene derivative, coumarin derivative, perylene derivative, or the like, as a host.

Examples of green dopants which can be used include quinacridone, quinacridone derivatives such as 2,9-dimethylquinacridone, and coumarin derivatives such as 3-(2-benzothiazolyl)-7-diethylaminocoumarin(coumarin 540).

Examples of red dopants which can be used include dicyanomethylene pyrane pigments such as 4-dicyanomethylene-2-methyl-6-(p-dimethylaminostyryl)-4H-pyrane (abbreviated as DCM) and 4-dicyanomethylene-2-methyl-6-[2-(9-urolidyl)ethenyl]-4H-thiopyrane, phenoxazone derivatives, and squarylinium pigments.

The blue light emitting layer 12 is formed by the vapor deposition of tetraphenyl cyclopentadiene, pentaphenyl cyclopentadiene, tetraphenyl butadiene derivatives, perylene derivatives, dibenzonaphthacene, benzopyrene, etc.

Next, a material which acts as an electron carrier, e.g., an 8-quinolinole metal complex such as tris(8-quinolinole) aluminum and bis(8-quinolinole)magnesium, an oxadiazole derivative, perylene derivative, etc., is vapor-deposited, forming the electron transporting layer 13.

Finally, the in vacuo vapor deposition of Mg:Ag or Al:Li from an alloy thereof or using a vapor codeposition method is performed, and a pixel electrode layer, i.e., cathode 14, is formed.

Thus, a three-layer film (12+13+14) composed of a light emitting layer 12, electron transporting layer 13, and pixel electrode layer, i.e., cathode layer 14 is formed uniformly on both the separation wall 11 of adhering developer and the exposed photosensitive body surface.

After vapor deposition, as shown in FIG. 7, the transparent electrode 2 is biased to a negative potential, the devel-oper used in the separation wall for the light emitting parts is removed by transfer from the panel substrate, light emitting pattern formation and cathode separation are performed, and pixel formation is carried out. As the method of removing the developer, after vapor deposition, a transfer medium 15 such as a polymer sheet of polyethylene, etc., or dust-free paper having a thickness of approximately 10 μm is placed on the substrate, a positive electrical field is applied by means of a transfer member 16 of a corona charger (scorotron or the like) or a contact charger (transfer roller or the like) from the back face of the transfer medium 15, and the developer used in the separation wall is transferred to the transfer medium 15 and removed. At this time, the 3-layer film (12+13+14) is also selectively removed together with the developer, and the three-layer film (12+13+14) is patterned.

Figure 8:
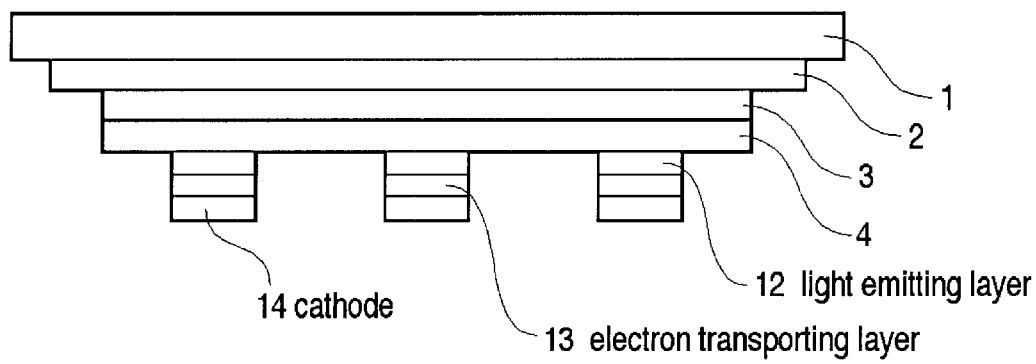
FIG. 8 is a schematic sectional view of organic EL panels formed in the first mode and second mode of the method of manufacturing an organic EL panel in a working example of the present invention.

In this way, as shown in FIG. 8, the pattern of the light emitting part is formed, cathode separation is performed, and a mono-color organic EL panel is completed. Specifically, a three-layer laminate composed of the light emitting layer 12, electron transporting layer 13, and pixel electrode, i.e., cathode 14 is separated and formed on the charge transfer layer 4. In the organic EL panel the charge generating layer 3 functions as a positive old injection layer, and the charge transfer layer 4 functions as a positive hold transporting layer.

Second Mode

In the first mode described above, reversal development was performed, but as described above, positive development can also be performed. An example of positive development is described below.

The process up to the charging of the organic photosensitive layer is the same as that in the first working mode. However, while the photosensitive body electrostatic potential V0 varies according to the film thickness and transfer properties of the organic film formed, also when positive development is performed using a positive electrostatic developer, it is in a range of approximately −100 to −1000 V.

In the exposure process shown in FIG. 4, in the case of positive development, pattern exposure is performed by selectively scanning the light emitting part which is the target of vapor deposition using an exposure device 8 such as a laser beam or LED, or uniform exposure is performed on the light emitting part which is the target of vapor deposition through a photomask on which a pattern has been formed. Specifically, the charge to photosensitive body is exposed in the dot pattern of the pixel light emitting layer to be formed. The wavelength of the exposure device should be approximately 780 nm, which is the absorption wavelength of the charge generating layer, as in the first working mode. In this case, the dispersion pattern of the exposure potential Vi corresponds to the pixel dot pattern, and the dispersion pattern of the charge potential V0 area corresponds to the reverse pattern of the pixel dot pattern.

Figure 9:
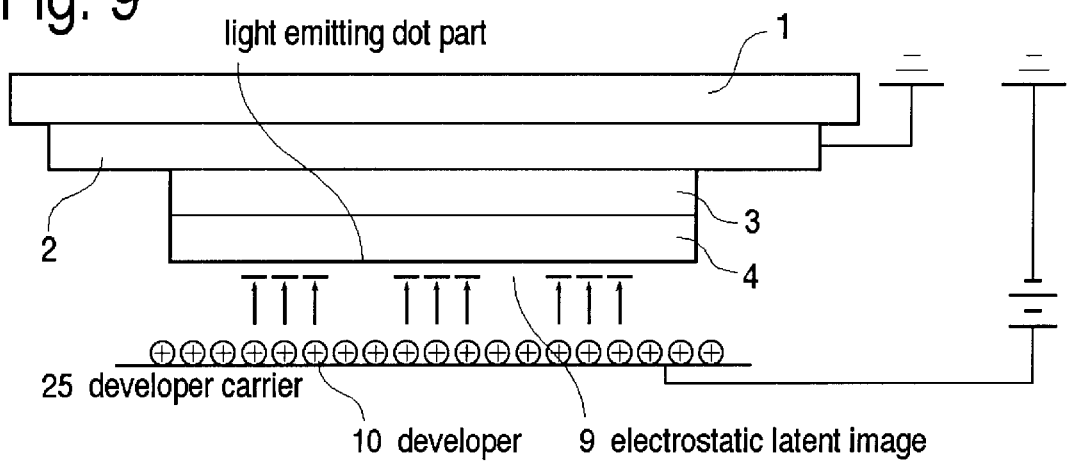
FIG. 9 is a sectional view explaining the development method according to the second mode of a method of manufacturing an organic EL panel in a working example of present invention.

Development is performed using a developing device like that shown in FIG. 21, as in the first working mode. However, in this case, the developer 10 is charged positively. The charge developer which has formed a thin layer on the developer carrier likewise in a positive development process using a positive electrostatic developer is carried to the opposing parts of the developer carrier and photosensitive body by the rotation of the developer carrier, and in accordance with an electrical field based on the potential difference between the photosensitive body surface charge potential V0 and exposure potential Vi and the development bias Vb applied to the developer carrier, is transferred to the electrostatic latent image on the photosensitive body surface and forms an image (FIG. 9). In this case, when the electrostatic latent image is developed using the positive developer 10, the positive developer 10 adheres to the reverse pattern area of the pixel dot pattern of the charge potential V0 (negative potential), and does not adhere to the pixel dot pattern having the exposure potential Vi.

In this case also, as with the first working mode, the developer carrier and organic photosensitive body may be in contact, and if they are within a proximal distance, the developer will fly to the photosensitive body due to the electrical field, so that the two bodies may be separated by a distance of about 100 to 300 μm. By performing non-contact development, the clouding and scattering of developer on the non-image areas can be reduced.

The development process shown in FIG. 9 is positive development in which the photosensitive body potential and the electrostatic polarity of developer are in reverse polarity. In the electrostatic latent image shown in FIG. 9, which is formed by exposure in the dot pattern, the exposure potential Vi is distributed in the pixel dot pattern, and the electrostatic charge potential V0 (negative potential) is distributed in the reverse pattern of the pixel dot pattern. When this electrostatic latent image is developed using the positive developer 10, by biasing the transparent substrate 2 to ground potential, the positive developer 10 adheres to the reverse pattern area of the pixel dot pattern of the charge potential V0 (negative potential), and does not adhere to the pixel dot pattern having the exposure potential Vi.

Figure 10:
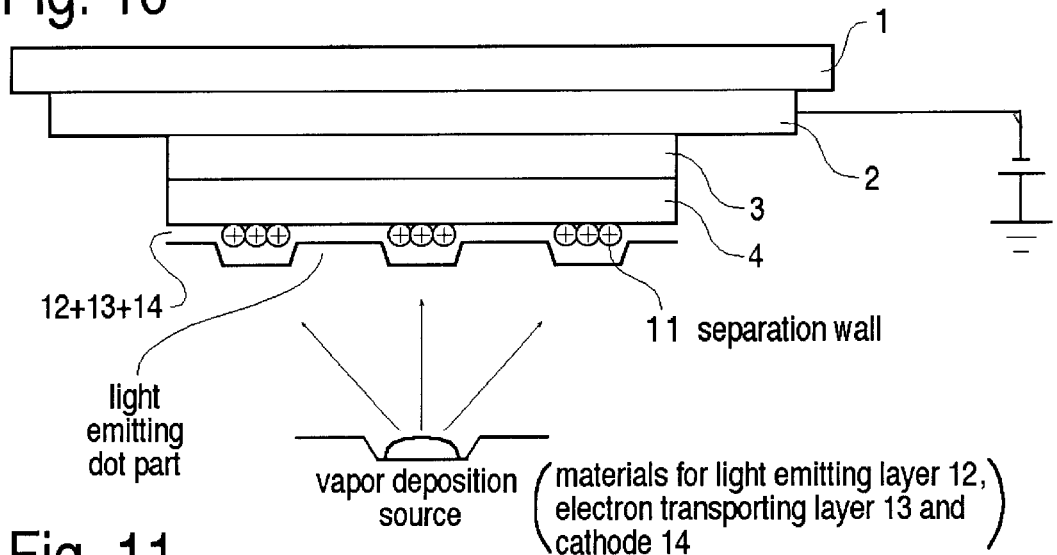
FIG. 10 is a sectional view explaining the method of forming a laminate of a light emitting layer, electron transporting layer, and cathode in the second mode of a method of manufacturing an organic EL panel in a working example of the present invention.

Next, as shown in FIG. 10, by biasing the transparent electrode 2 to a negative potential and vapor deposition, a three-layer film composed of a light emitting layer 12, electron transporting layer 13, and pixel electrode layer, i.e., cathode layer 14 is formed. The process of forming the three-layer film composed of a light emitting layer 12, electron transporting layer 13, and pixel electrode layer, i.e., cathode layer 14, is similar to that in the first working mode and detailed description thereof is omitted.

Figure 11:
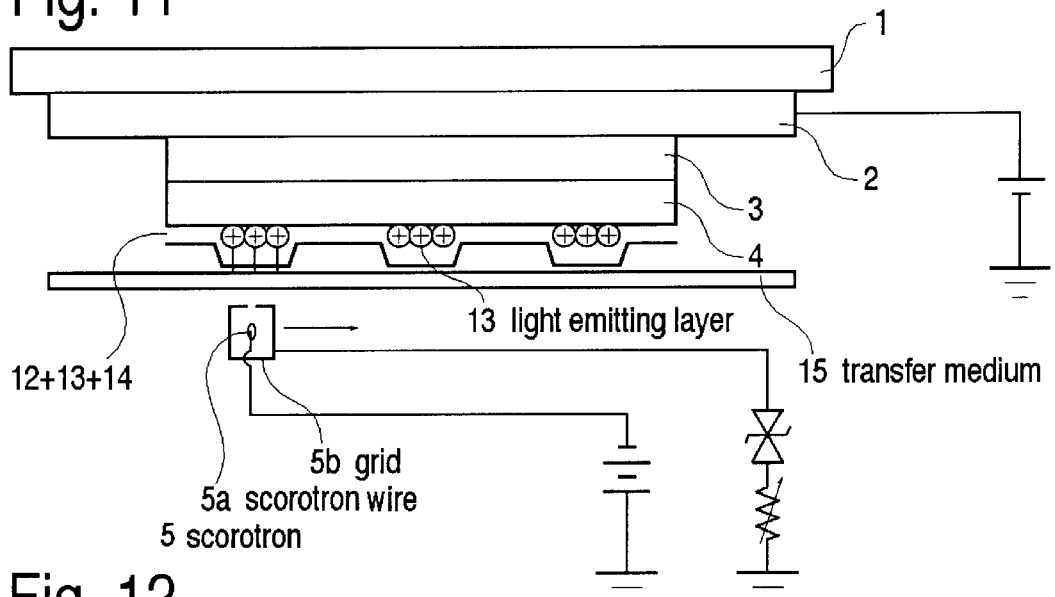
FIG. 11 is a sectional view explaining the method of removing a laminate of a light emitting layer, electron transporting layer, and cathode in the second mode of a method of manufacturing an organic EL panel in a working example of the present invention.

After vapor deposition, as shown in FIG. 11, the developer used in the separation walls of the light emitting parts is removed by transfer from the panel substrate, light emitting pattern formation and cathode separation are performed, and pixels are formed. As a method of removing the developer, the transparent electrode 2 is biased to a positive potential, a transfer medium 15 such as a polyethylene or other polymer sheet or dust-free paper having a thickness of about 10 μm is placed on the substrate after vapor deposition, a negative electrical field is applied by means of a transfer member of a corona charger such as a scorotron 5 or contact charger (transfer roller or the like) from the back face of the transfer medium 15, and the developer used in the separation walls is transferred to the transfer medium 15 and removed. At this time, the three-layer film (12+13+14) is selectively removed together with the developer, and patterning is formed on the three-layer film (12+13+14).

Thus, as shown in FIG. 8, pattern formation and cathode separation are performed for the light emitting part, and a monocolor organic EL panel is completed. Specifically, a three-layer laminate composed of the light emitting layer 12, electron transporting layer 13, and pixel electrode, i.e., cathode 14 is separated and formed on the charge transfer layer 4.

The process of colorizing the organic EL panel, i.e., the process of producing the color organic EL panel, is performed by repeating the aforementioned monocolor organic EL panel manufacturing process in each color for the three colors of red, green, blue. Thus, in the following explanation, the details of the process performed for each color are basically the same as those in the method of manufacturing the aforesaid monocolor organic EL panel, so detailed explanation of the process is omitted. On the other hand, since the method of producing a color organic EL panel, like the method of manufacturing of monocolor organic EL panel, can be performed in two modes, a reversal development process, wherein the photosensitive body potential and the charge polarity of the developer have the same polarity, and a positive development process, wherein the photosensitive body potential and the charge polarity of the developer have the opposite polarity, each mode is explained below.

Third Mode

The method of producing a color organic EL panel which uses reversal development in which the photosensitive body potential and the charge polarity of the developer have the same polarity is explained as follows.

Figure 12:
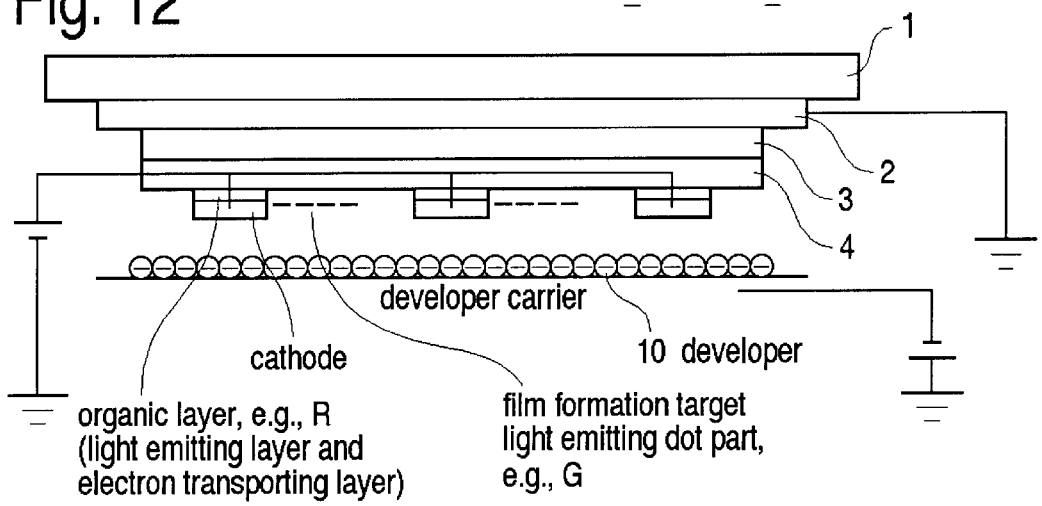
FIG. 12 is a sectional view explaining the method of developing a latent image for the second color in the third mode of a method of manufacturing an organic EL panel in a working example of the present invention.

FIG. 12 shows the state in which a three-layer laminate composed of a light emitting layer 12, electron transporting layer 13, and pixel electrode layer, i.e., cathode layer 14, for the first color among the three colors of red, green, and blue, e.g., red, is formed on a charge transfer layer 4 in accordance with the first mode of the method of manufacturing a monocolor organic EL panel described above. The difference with the above-described first working mode lies in the fact that, when an electrostatic latent image is formed by exposing the areas other than the desired red light emitting dots, in the case of reversal development, the areas other than the red light emitting dots correspond to the [dot width of the other two colors (i.e., green and blue)]+[space portion separating each color]. Accordingly, this type of electrostatic latent image is developed using a developer having the same electrostatic polarity as the photosensitive body, and a separation wall is produced. Since this separation wall covers an area equivalent to the [dot width of the other two colors (i.e., green and blue)]+[space portion separating each color], it is referred to as a tight-fitting mask with regard to the method of manufacturing a color organic EL panel.

In FIG. 12, the transparent electrode 2 is biased to ground potential, preferably, a red cathode 14 is biased to ground potential through the charge transfer layer 4, the photosensitive thin film wherein a three-layer laminate composed of the red light emitting layer 12, electron transporting layer 13, and pixel electrode, i.e., cathode 14, is formed on the charge transfer layer, is uniformly charged with a negative charge, and an electrostatic latent image is formed by exposure in a reverse pattern of the dot pattern of the second color among the three colors of red, green and blue, e.g., green, on the charge transfer layer 4. For the sake of simplification in the drawings, the light emitting layer 12 and electron transporting layer 13 are depicted as one organic layer. Moreover, when the red cathode 14 is biased to the ground potential via the charge transfer layer 4, charging in a negative charge is not performed on the red cathode 14, but the fact that the electrostatic latent image formed corresponds to the reverse pattern of the green dot pattern remains unchanged.

Next, as shown in FIG. 12, when the transparent electrode 2 is biased to ground potential, and the red cathode 14 is biased to ground potential through the charge transfer layer 4 during uniform charging, the red cathode 14 is biased to positive potential through the charge transfer layer 4, and the exposed part of the photosensitive thin film is developed using the powder developer that has been negatively charged. As a result, as shown in FIG. 13, a separation wall formed of powder developer, i.e., second tight-fitting mask 11, is formed. This second tight-fitting mask 11 is composed of a powder developer that has been the negatively charged, and covers the area corresponding to the portion other than the green light emitting dots, i.e., [dot width of the other two colors (i.e., green and blue)]+[space portion separating each color]. Accordingly, the second tight-fitting mask 11 covers the three-layer laminate composed of the red light emitting layer 12, electron transporting layer 13, and pixel electrode, i.e., cathode 14, and is formed in a position displaced from the position of the tight-fitting mask (referred to as the first tight-fitting mask) used for the formation of the red light emitting layer. Next, as shown in FIG. 13, the transparent substrate 2 is biased to a positive potential, and the green light emitting layer, electron transporting layer, and pixel electrode layer are vapor-deposited in that order by uniform in vacuo vapor deposition.

After vapor deposition, using the charge of the electrostatic latent image, the powder developer used in the second tight-fitting mask is transferred and removed, and the pixel light emitting layer and pixel electrode of the green pixel pattern are formed. In this state, as shown in FIG. 14, the three-layer laminate of the red light emitting layer, electron transporting layer, and pixel electrode and the three-layer laminate of the red light emitting layer, electron transporting layer, and pixel electrode are formed on the charge transfer layer 4.

In FIG. 14, the transparent electrode 2 is biased to ground potential, preferably, red and green cathodes 14 are biased to ground potential through the charge transfer layer 4, photosensitive thin films wherein the three-layer laminate composed of the red light emitting layer, electron transporting layer, and pixel electrode and three-layer laminate composed of the green light emitting layer, electron transporting layer, and pixel electrode are formed on the charge transfer layer 4 are uniformly charged, and an electrostatic latent image is formed by exposure in a reverse pattern of the dot pattern of the third color among the three colors of red, green and blue, i.e., blue. When the red and green cathodes 14 are biased to ground potential through the charge transfer layer 4, a negative charge is not charged over the red and green cathodes 14, but the fact that the electrostatic latent image formed corresponds to the reverse pattern of the blue dot pattern remains unchanged.

Next, as shown in FIG. 14, the transparent electrode 2 is biased to ground potential, and in the case where the red and green cathodes 14 are biased to ground potential through the charge transfer layer 4 in the uniform charging process, the red and green cathodes 14 are charged to a positive potential through the charge transfer layer 4, and the exposed portion of the photosensitive thin film is developed using a powder developer that has been negatively charged. As a result, as shown in FIG. 15, a separation wall formed of powder developer, i.e., a third tight-fitting mask 11, is formed. This third tight-fitting mask 11 is composed of powder developer that has been negatively charged and covers an area corresponding to the portions other than the blue light emitting dots, i.e., the [dot width of the other two colors]+[space portion separating each color]. Accordingly, the third tight-fitting mask 11 covers the three-layer laminate composed of the red light emitting layer 12, electron transporting layer 13, and pixel electrode, i.e., cathode 14, and the three-layer laminate composed of the green light emitting layer 12, electron transporting layer 13, and pixel electrode, i.e., cathode 14, and is formed in a position displaced from the position of the first tight-fitting mask used for the formation of the red light emitting layer and also displaced from the position of the second tight-fitting mask used for the formation of the green light emitting layer.

Next, as shown in FIG. 15, the transparent substrate 2 is biased to a positive potential, and the blue light emitting layer, electron transporting layer, and pixel electrode layer are vapor-deposited in that order by uniform in vacuo vapor deposition. After vapor deposition, using the charge of the electrostatic latent image, the powder developer used in the third tight-fitting mask is transferred and removed, and the pixel light emitting layer and pixel electrode of the blue pixel pattern are formed.

Figure 16:
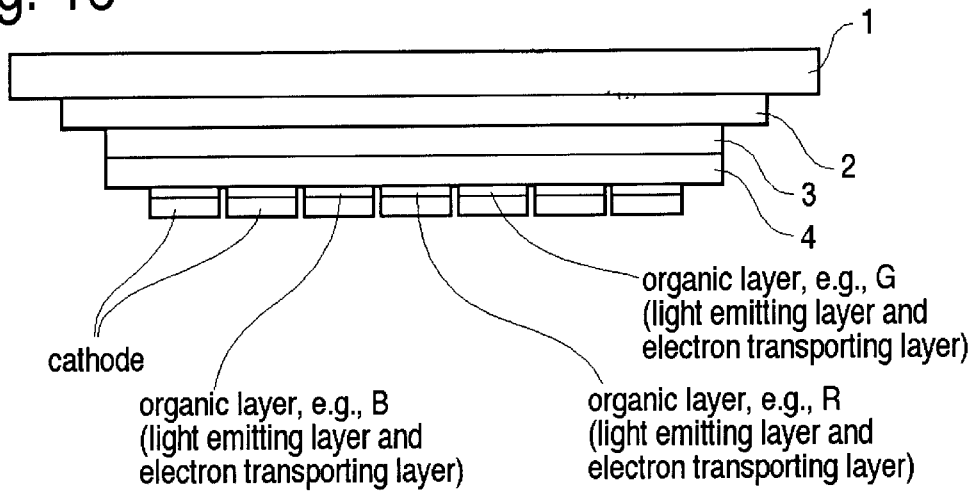
FIG. 16 is a schematic sectional view of color organic EL panels formed in the third mode and fourth mode of a method of manufacturing an organic EL panel in a working example of the present invention.

Thus, as shown in FIG. 16, a three-layer laminate of a red light emitting layer, electron transporting layer, and pixel electrode, a three-layer laminate of a green light emitting layer, electron transporting layer, and pixel electrode, and a three-layer laminate of a blue light emitting layer, electron transporting layer, and pixel electrode, are separated from each other and formed on the charge transfer layer 4.

Fourth Mode

The method of manufacturing a color organic EL panel using a positive development process wherein the photosensitive body potential and the charge polarity of the developer are of opposite polarities is as described below.

Figure 17:
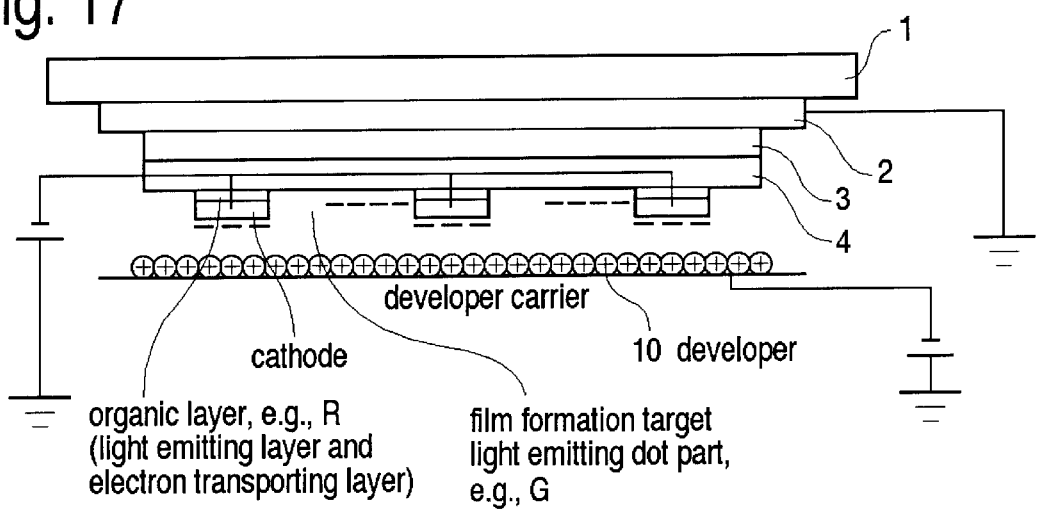
FIG. 17 is a sectional view explaining the method of developing a latent image for the second color in the fourth mode of a method of manufacturing an organic EL panel in a working example of the present invention.

FIG. 17 shows the state in which, in accordance with the second mode of manufacturing a monocolor organic EL panel described above, a three-layer laminate composed of a red light emitting layer 12, electron transporting layer 13, and pixel electrode, i.e., cathode 14, of one color among the three colors of red, green, and blue, e.g., red, is formed on a charge transfer layer 4. The difference from the second mode described above lies in the fact that the separation wall formed by developing the electrostatic latent image formed by exposure of the desired red light emitting dots, using a charged developer having the opposite polarity as the polarity of the charged photosensitive body, covers an area corresponding to the portions other than the red light emitting dots, i.e., the [dot width of the other two colors (i.e., green and blue)]+[space portion separating each color], and the separation wall thus formed is referred to as a tight-fitting mask, as in the third mode.

In FIG. 17, the transparent electrode 2 is biased to ground potential, and preferably, the cathode 14 is biased to ground potential through the charge transfer layer 4, a photosensitive thin film formed on the charge transfer layer 4, wherein the three-layer laminate composed of the red light emitting layer 12, electron transporting layer 13, and pixel electrode, i.e., cathode 14, is uniformly charged, and an electrostatic latent image is formed by exposure in a reverse pattern of the dot pattern of the second color among the three colors of red, green and blue, e.g., green. For the sake of simplification in the drawings, the light emitting layer 12 and electron transporting layer 13 are depicted as one organic layer.

Figure 18:
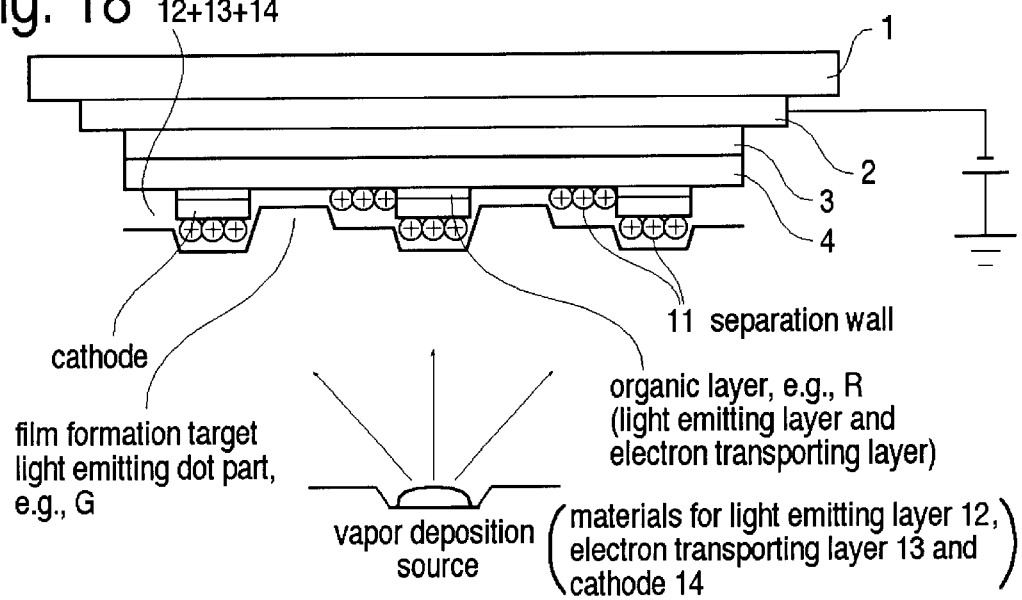
FIG. 18 is a sectional view explaining the method of removing a laminate of a light emitting layer, electron transporting layer, and cathode for the second color in the fourth mode of a method of manufacturing an organic EL panel in a working example of the present invention.

Next, as shown in FIG. 17, when the transparent electrode 2 is biased to ground potential, and the red cathode 14 is biased to ground potential through the charge transfer layer 4 in the uniform charging process, the unexposed portion of the photosensitive thin film is developed using a positively charged powder developer, and, as shown in FIG. 18, a separation wall formed of powder developer, i.e., a second tight-fitting mask 11, is formed. This second tight-fitting mask 11 is composed of powder developer that has been positively charged, and covers an area corresponding to the portions other than the green light emitting dots, i.e., the [dot width of the other two colors]+[space portion separating each color]. Accordingly, the second tight-fitting mask 11 covers the three-layer laminate composed of the red light emitting layer 12, electron transporting layer 13, and pixel electrode, i.e., cathode 14, and is formed in a position displaced from the position of the tight-fitting mask used for the formation of the red light emitting layer (referred to as the first tight-fitting mask).

Next, as shown in FIG. 18, the transparent substrate 2 is biased to a negative potential, and the green light emitting layer, electron transporting layer, and pixel electrode layer are vapor-deposited in that order by uniform in vacuo vapor deposition.

After vapor deposition, using the charge of the electrostatic latent image, the powder developer used in the third tight-fitting mask is transferred and removed, and the pixel light emitting layer and pixel electrode of the green pixel pattern are formed. In this state, as shown in FIG. 19, the three-layer laminate composed of the red light emitting layer, electron transporting layer, and pixel electrode and the three-layer laminate composed of the green light emitting layer, electron transporting layer, and pixel electrode are formed on the charge transfer layer 4.

Figure 19:
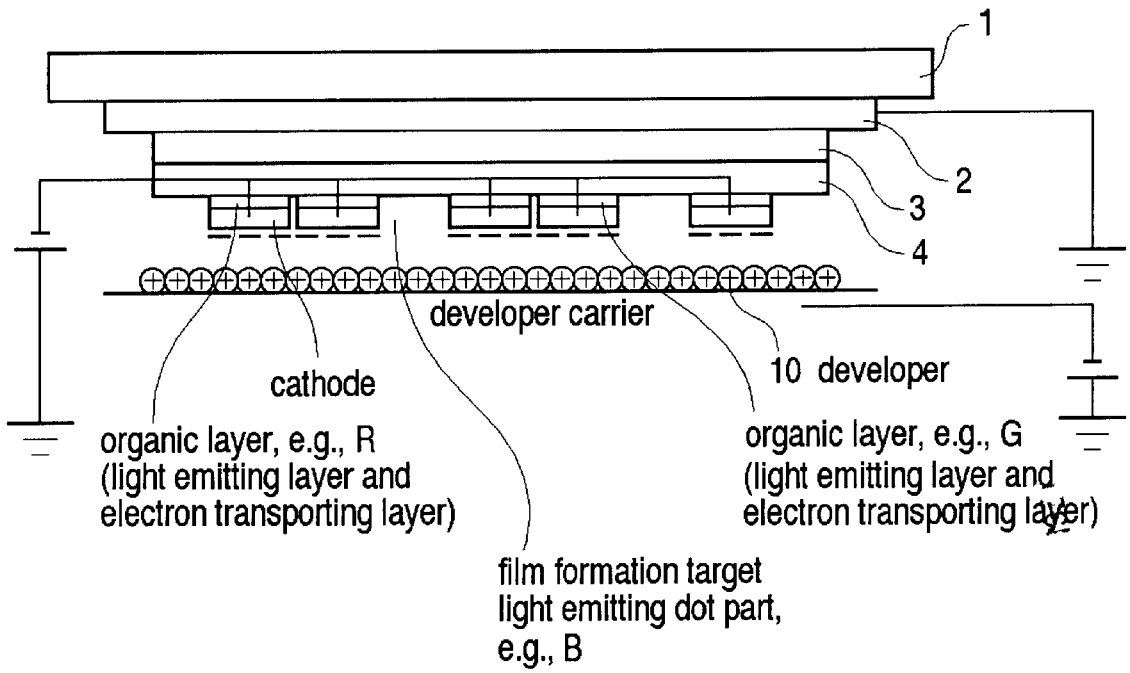
FIG. 19 is a sectional view explaining the method of developing a latent image for the third color in the fourth mode of a method of manufacturing an organic EL panel in a working example of the present invention.

In FIG. 19, the transparent electrode 2 is biased to ground potential, and preferably, red and green cathodes 14 are biased to ground potential through the charge transfer layer 4, a photosensitive thin film, wherein the three-layer laminate composed of the red light emitting layer, electron transporting layer, and pixel electrode and the three-layer laminate composed of the green light emitting layer, electron transporting layer, and pixel electrode are formed on the charge transfer layer 4, is uniformly charged, and an electrostatic latent image is formed by exposure in a reverse pattern of the dot pattern of the third color among the three colors of red, green and blue, i.e., blue.

Figure 20:
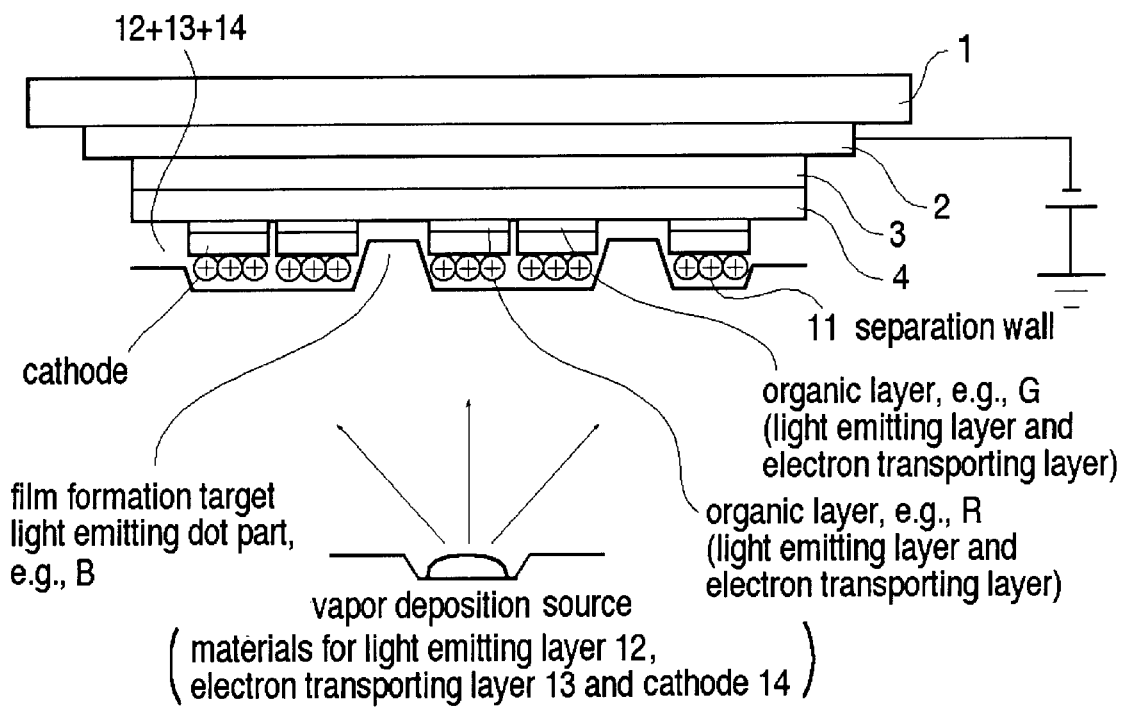
FIG. 20 is a sectional view explaining the method of removing a laminate of a light emitting layer, electron transporting layer, and cathode for the third color in the fourth mode of a method of manufacturing an organic EL panel in a working example of the present invention.

Next, as shown in FIG. 19, when the transparent electrode 2 is biased to ground potential, and the red and green cathodes 14 are biased to ground potential through the charge transfer layer 4 in the uniform charging process, the unexposed portion of the photosensitive thin film is developed using a powder developer, as shown in FIG. 20, forming a separation wall formed of powder developer, i.e., a third tight-fitting mask 11. This third tight-fitting mask 11 is composed of powder developer that has been positively charged, and covers an area corresponding to the portions other than the blue light emitting dots, i.e., the [dot width of the other two colors]+[space portion separating each color]. Accordingly, the third tight-fitting mask 11 covers the three-layer laminate composed of the red light emitting layer 12, electron transporting layer 13, and pixel electrode, i.e., cathode 14, and the three-layer laminate composed of the green light emitting layer 12, electron transporting layer 13, and pixel electrode, i.e., cathode 14, and is formed in a position displaced from the position of the first tight-fitting mask used for the formation of the red light emitting layer and also displaced from the position of the second tight-fitting mask used for the formation of the green light emitting layer.

Next, as shown in FIG. 20, the transparent substrate 2 is biased to a positive potential, and the blue light emitting layer, electron transporting layer, and pixel electrode layer are vapor-deposited in that order by uniform in vacuo vapor deposition.

After vapor deposition, using the charge of the electrostatic latent image, the powder developer used in the third tight-fitting mask is transferred and removed, and the pixel light emitting layer and pixel electrode of the blue pixel pattern are formed.

Thus, as shown in FIG. 16, a three-layer laminate of a red light emitting layer, electron transporting layer, and pixel electrode, a three-layer laminate of a green light emitting layer, electron transporting layer, and pixel electrode, and a three-layer laminate of a blue light emitting layer, electron transporting layer, and pixel electrode, are separated from each other and formed on the charge transfer layer 4.

In the process described above, since exposure in development can be performed as desired on a fine region, the film forming sequence may be selected as desired.

Working Example 1

An ITO film was formed by sputtering as an electrode in a thickness of 20 nm on a glass substrate having a thickness of 0.7 mm, and a transparent electrode was formed by lithography and wet etching. The sheet resistance was 15 $\Omega/\square$, the wiring width 300 $\mu$m, and the space width 30 $\mu$m.

As a charge generating layer (hole injection layer) applied thereon as a coating, titanyl phthalocyanine and butyral resin were measured out in a weight ratio of 3.0:1, dissolved in THF (tetrahydrofuran), dispersed with a mixer, and thereby a dispersion coating material having a solid component ratio of 3 wt % was prepared. Said coating material was applied by dipping to form a coating film on the glass substrate, dried, and a thin film having a film thickness of 300 nm was formed.

As a charge transporting layer (hole transporting layer), N,N'-diphenyl-N,N'-di(3-methylphenyl)-1,1'-biphenyl-4,4'-diamine and polycarbonate were measured out in a weight ratio of 2.5:1, dissolved in dichloromethane, and a dispersion coating material having a solid component ratio of 3 wt % was prepared. Said coating material dissolved in dichloromethane was applied by dipping to form a thin film having a film thickness of 300 nm.

The substrate on which the organic photosensitive body was formed as described above was then charged using a contact type charger in which a charging roller was used. The voltage applied to the charging roller was −700 V, and the surface charge potential V0 to the glass substrate in fixed voltage control was −400 V.

Next, using a semiconductor laser, pattern exposure was performed selectively on portions of the interelectrode space (the desired location of the pixel pattern) so as to be orthogonal to the ITO wiring pattern. The wavelength of the exposure device was 780 nm, the absorption wavelength of the charge generating agent. The exposure dosage was 0.3 mW/cm$^2$, and an electrostatic latent image having an exposure spot diameter of 10 $\mu$m, an exposure width of 30 $\mu$m, and an exposure potential Vi=−40 V was obtained.

Next, in the developer used as the developing agent, a spherical polymerized developer having a volume-centered granule diameter of 6 $\mu$m and an average charge amount of 8 $\mu$C/g, in which a positively charged charge control agent (CCA) was incorporated at the time of polymerization of a styrene-acrylic copolymer, was used, a development bias Vb=−160 volts was applied to the developer carrier (roller) 25 in development, and the developer (separation wall) was made to adhere to the space portion (unexposed portion) between the electrodes.

Thereupon, as a green light emitting layer, as a host tris(8-quinolinol)aluminum (alumiquinoline) was vapor co-deposited with quinacridone (doping concentration 5 wt %) as a dopant in a thickness of 25 nm, and next, as an electron transporting layer, tris(8-quinolinol)aluminum was formed in a thickness of 30 nm by vapor deposition. Next, Mg:Ag was vapor-deposited in a thickness of 150 nm from two sources to form a cathode.

Finally, a dust-free paper having a thickness of about 10 $\mu$m was placed on the substrate after vapor deposition, using a transfer roller, a transfer bias Vp of −400 V was applied, and the developer used in the separation wall was transferred from the panel substrate to the dust-free paper and thereby removed. In this way, light emitting pattern formation and electrode separation were performed, and pixels were formed.

By this means a green panel having a dot pitch of 300×300 μm, a space of 30 μm, and a pixel number of 256×64 dots was prepared.

Working Example 2

An ITO film was formed by sputtering as an electrode in a thickness of 20 nm on a glass substrate having a thickness of 1.1 mm, and a transparent electrode was formed by lithography and wet etching. The sheet resistance was 15 Ω/□, the wiring width 160 μm, and the space 50 μm.

As a charge generating layer (hole injection layer) applied thereon as a coating, copper phthalocyanine and butyral resin were measured out in a weight ratio of 3.0:1, dissolved in THF, dispersed with a mixer, and thereby a dispersion coating material having a solid component ratio of 5 wt % was prepared. Said coating material was applied by dipping to form a coating film on the glass substrate, dried, and a thin film having a film thickness of 200 nm was formed.

As a charge transporting layer (hole transporting layer), N,N'-diphenyl-N,N'-bis(α-naphthyl)-1,1'-biphenyl-4,4'-diamine and polycarbonate were measured out in a weight ratio of 2.5:1, dissolved in dichloromethane, and a dispersion coating material having a solid component ratio of 2 wt % was prepared. Said coating material dissolved in dichloromethane was applied by dipping to form a thin film having a film thickness of 300 nm.

The substrate on which the organic photosensitive body had been formed as described above was then charged to a surface charge potential V0 of −400 V using a scorotron. The applied voltage of the scorotron wire Sa was approximately −3 kV D.C., the fixed current controlled to 500 μA, and the grid 5b voltage Vg was made −400 V.

Next, in order to perform reversal development, selective exposure using a semiconductor laser was performed on the areas other than the desired light emitting pattern (the areas corresponding to space between cathodes+areas other than the desired color) so as to be orthogonal to the ITO wiring pattern. The wavelength, exposure dosage, and exposure spot diameter of the exposure device were the same as in Working Example 1. The electrostatic latent image formed had a photosensitive layer surface charge potential V0 of −400 V and exposure potential Vi of −50 V.

Using a polyester resin into which a charge control agent (CCA) using an electron-receptive substance such as a metal complex of a monoazo dye was pulverized to a volume center diameter of 6 μm as the developer, and making the average charge dosage −11 C/g and applying the development bias Vb of −150 V, development was performed, and the developer was made to adhere to the substrate part (exposed part) other than the light emitting part upon which vapor deposition was to be performed.

Thereupon, as a red light emitting layer, as a host tris(8-quinolinol)aluminum (alumiquinoline) was vapor co-deposited with 4-diaminomethylene-2-methyl-6-(p-dimethylaminostyryl)-4H-pyrane (DCM, doping concentration 5 wt %) as a dopant in a thickness of 25 nm, and next as an electron transporting layer, tris(8-quinolinol)aluminum (aliminoquinoline) was formed in a thickness of 35 nm by vapor deposition. Next, as a cathode, aluminum and lithium were vapor-codeposited in a thickness of 30 nm, and next aluminum only was vapor-deposited in a thickness of 100 nm.

After the red pattern was prepared, dust-free paper having a thickness of about 10 μm was placed on the substrate, a transfer bias Vp of 400 V was applied using a scorotron, and the separation wall (developer layer), i.e., tight-fitting mask, was removed from the substrate (FIG. 11). The applied voltage of the scorotron wire 5a was about 3 kV D.C., the fixed current controlled to 500 μA, and the grid 5b voltage Vg 400 V.

The processes of charging, exposure, development, vapor deposition, and transfer were repeated in the same way with regard to the formation of the green light emitting part as well. In reversal development, since the surface of the previously formed red light emitting part is a cathode, exposure was performed likewise without charging, by means of ground connection, and development was performed. In order to increase the development efficiency further, a bias having the opposite polarity as the polarity of the developer was applied to the cathode part (FIG. 12). As the green light emitting part, as a host tris(8-quinolinol) aluminum was vapor codeposited with 2,9-dimethylquinacridone (doping concentration 5 wt %) as a dopant in a thickness of 25 nm, and next, as an electron transporting layer, tris(8-quinolinol)aluminum was formed in a thickness of 35 nm by vapor deposition. Next, as a cathode, Al:Li was vapor-deposited in a thickness of 30, and then aluminum alone was vapor-deposited in the thickness of 100 nm (FIG. 13). The separation wall (developer layer), i.e., tight-fitting mask, was removed by the same transfer process as in the case of red.

The processes of charging, exposure, development, vapor deposition, and transfer were repeated in the same way with regard to the formation of the blue light emitting part as well. In the blue light emitting part, using 25 nm tetraphenylbutadiene, the electron transporting layer and cathode were formed by vapor deposition using the same materials and same film thickness as with red and green (FIG. 15). The separation wall (developer layer), i.e., tight-fitting mask, was removed by the same transfer process as in the case of red, and an organic EL panel was formed. Thus, a panel able to perform color display and having a dot pitch of 50 μm, space of 15 μm, and a pixel number of 320 dots horizontal×240 dots vertical was produced (FIG. 16).

An ITO film was formed in a film thickness of 20 nm by sputtering as an anode on a glass substrate having a thickness of 1.1 mm, and a transparent electrode was formed by lithography and wet etching. The sheet resistance was 15 Ω/□, the wiring width 160 μm, and the space 50 μm.

As a charge generating layer (hole injection layer) applied thereon as a coating, nonmetallic phthalocyanine and butyral resin were measured out in a weight ratio of 3.0:1, dissolved in THF, dispersed with a mixer, and thereby a dispersion coating material having a solid component ratio of 5 wt % was prepared. Said coating material was applied by spin-coating to form a coating film on the glass substrate on which the ITO thin film was formed, dried, and a thin film having a film thickness of 200 nm was formed.

As a charge transporting layer (hole transporting layer), N,N'-diphenyl-N,N'-bis(α-naphthyl)-1,1'-biphenyl-4,4'-diamine and polycarbonate were measured out in a weight ratio of 2.5:1, dissolved in dichloromethane, and a dispersion coating material having a solid component ratio of 2 wt % was prepared. Said coating liquid dissolved in dichloromethane was applied by spin-coating to form a thin film having a film thickness of 300 mn.

The substrate on which the organic photosensitive body had been formed as described above was then charged to a surface charge potential V0 of −400 V using a scorotron. The applied voltage of the scorotron wire 5a was approximately −3 kV D.C., the fixed current was controlled to 500 μA, and the grid 5b voltage Vg was −400 V.

Next, selective exposure using a semiconductor laser was performed on the areas other than the desired light emission pattern so as to be orthogonal to the ITO wiring pattern (positive development). The wavelength, exposure dosage, and exposure spot diameter of the exposure device were the same as in Working Example 1. The electrostatic latent image formed had a photosensitive layer surface charge potential V0 of −400 V, and an exposure potential Vi of −40 V.

As the developer, a spherical polymerized developer resin obtained by incorporating a positively charged charge control agent (CCA) during the polymerization of a styrene-acrylic copolymer, and having a volume center diameter of 6 μm and average charge dosage of 10 μC/g, was used. Applying a development bias Vb of −150 V, development was performed, and the developer was made to adhere to the substrate part (exposed part) other than the light emitting part upon which vapor deposition was to be performed.

Thereupon, as a red light emitting layer, as a host tris(8-quinolinol)aluminum (alumiquinoline) was vapor co-deposited with 4-diaminomethylene-2-methyl-6-(dimethylaminostyryl)-4H-pyrane (DCM, doping concentration 5 wt %) as a dopant in a thickness of 25 nm, and next as an electron transporting layer, tris(8-quinolinol)aluminum (aliminoquinoline) was formed in a thickness of 35 nm by vapor deposition. Next, as a cathode, aluminum and lithium were vapor-codeposited in a thickness of 30 mn, and next aluminum only was vapor-deposited in a thickness of 100 nm. After the red pattern was prepared, dust-free paper having a thickness of about 10 μm was placed on the substrate, a transfer bias Vp of 400 V was applied using a scorotron, and the separation wall (developer layer), i.e., tight-fitting mask, was removed from the substrate (FIG. 11). The applied voltage of the scorotron wire 5a was about 3 kV D.C., the fixed current controlled to 500 μA, and the grid 5b voltage was Vg−300 V.

The processes of charging, exposure, development, vapor deposition, and transfer were repeated in the same way with regard to the formation of the green light emitting part as well. In positive development, since a developer having the opposite polarity as the surface potential (charge potential) of the organic photosensitive body is used in development, a bias voltage of −250 V, a polarity opposite the polarity of the developer, was applied to the cathode of the previously formed red light emitting part (FIG. 17). By this means, development was also performed on the red-emitting part, creating a masked state. In other words, a separation wall (developer layer), i.e., a tight-fitting mask, was formed.

As the green light emitting part, as a host tris(8-quinolinol)aluminum (Alq3) was vapor co-deposited with quinacridone (doping concentration 3 wt %) as a dopant in a thickness of 25 nm, and next, as an electron transporting layer, 2-(4'-t-butylphenyl)-5-(4'-biphenyl) 1,3,4-oxadiazole was formed in a thickness of 35 nm by vapor deposition. Next, as a cathode, Al:Li was vapor-codeposited in a thickness of 30 nm, and next aluminum only was vapor-deposited in a thickness of 100 nm (FIG. 18). The separation wall (developer layer), i.e., tight-fitting layer, was then removed by the same transfer process as in the case of red.

The processes of charging, exposure, development, vapor deposition, and transfer were repeated in the same way with regard to the formation of the blue light emitting part as well.

In the blue light emitting part, pentaphenylcyclopentadiene was vapor-deposited to 25 nm, and the electron transporting layer and cathode were formed by vapor deposition using the same materials and same film thickness as with red and green. The separation wall (developer layer), i.e., tight-fitting mask, was removed by the same transfer process as in the case of red, and an organic EL panel was formed.

Thus, a panel able to perform color display and having a dot pitch of 50 μm, space of 15 μm, and a pixel number of 320 dots horizontal×240 dots vertical was produced.

Conventional Example

As a comparison with the above-described working examples, an ITO thin film having a film thickness of 120 μm and a surface resistance of 15 Ω/□ was formed by sputtering as a clear electrode on glass substrate having a thickness of 1.1 mm, and thereupon, as a hole injection and transportation layer, N,N'-diphenyl-N,N'-bis(α-naphthyl)-1, 1'-biphenyl-4,4'-diamine was formed in a thickness of 50 nm by in vacuo vapor deposition. Thereupon, as a red light emitting layer, tris(8-quinolinol)aluminum (alumiquinoline) was vapor co-deposited with DCM in a doping concentration 5 wt % as a dopant in a thickness of 25 nm, and next, as a green light emitting layer, tris(8-quinolinol)aluminum and, as a dopant, quinacridone in a concentration of 3 wt % were co-deposited to 25 nm, and as a blue light emitting layer, pentaphenylcyclopentadiene was vapor-deposited to 25 nm, and finally, as an electron transporting layer, an alumiquinoline complex was vapor-deposited to 30 nm.

The color separation of the three colors of red, green, blue, was performed by sliding the metal mask. Next, using ITO as a metal mask, aluminum and lithium were vapor-codeposited in a thickness of 30 nm so as to be orthogonal to the organic thin film, and next, aluminum only was vapor-deposited in a thickness of 120 nm to form a cathode, and the organic EL panel was produced.

By the color separation method using the mask described above, the positioning of the mask at a dot pitch of 80 μm and a space of 40 μm or less was difficult, color displacement occurred, and the panel was difficult to manufacture.

As explained above, by means of the present invention, since an organic photosensitive body is formed on a transparent substrate, exposure and development are performed selectively, and a light emitting pattern is formed, in comparison with methods whereby a mask plate is shifted in in vacuo vapor deposition which is used as the conventional method of producing organic EL panels, there is no curling-in of materials due to warping or displacement of the mask, separation defects are eliminated, and a high level of dimensional accuracy and positional accuracy can be maintained.

Furthermore, since the resolution of a light emitting pattern is dependent upon the exposure device and granule diameter of the developer, fine processing can be performed down to about 10 μm.

Moreover, the film formation and color separation processes are simple, allowing throughput to be increased and poor efficiency to be improved.

By dispersing a hole injection and transporting material in a binder, the adhesive properties at the ITO and organic layer interface are improved, and agglomeration of materials and changes in film quality are eliminated. By this means, the heat resistance of the organic EL panel is improved, and the useful life is extended.

What is claimed is:

1. A method of forming pixel light emitting layers and pixel electrodes in an organic EL panel wherein an organic light emitting material is laminated between a pair of opposing electrodes, at least one of which is transparent or semitransparent, said method comprising:

a transparent substrate being prepared wherein a transparent or semitransparent common electrode is formed on at least one face thereof;

a photosensitive thin film having a charge generating layer and charge transfer layer being formed on said common electrode;

said photosensitive thin film being uniformly charged, and an electrostatic image being formed by exposure in a specified pattern;

the unexposed portions or the exposed portions of said photosensitive thin film being developed using a powder developer, and a separation wall being formed from said charged powder developer;

a laminate of a light emitting layer, an electron transporting layer, and a pixel electrode layer being uniformly deposited in that order; and after deposition, using the charge of said electrostatic latent image, said powder developer used in said separation wall being removed by transfer, and the laminate being selectively removed together therewith;

selective removal of the laminate causing pattern formation of the pixel light emitting layer and separation of the pixel electrode layer to be performed simultaneously, and a pixel light emitting layer and pixel electrode to be formed in a specified pixel pattern.

2. A method according to claim 1, wherein said laminate of a light emitting layer, electron transporting layer, and pixel electrode layer is formed by the uniform vapor deposition of a light emitting layer, electron transporting layer, and pixel electrode layer in that order by in vacuo vapor deposition.

3. A method according to claim 1, wherein said development is performed using a powder developer having a granule size of about 6 $\mu$m.

4. A method according to claim 1, wherein a pulverized developer obtained by kneading a charge control agent into a polymer selected from the group consisting of polyesters, styrene-acrylic copolymers, and acrylics, and pulverized to a suitable granule size, or a polymerized developer, produced by incorporating said charge control agent when said polymer is polymerized and inducing polymerization to a suitable granule size, is used as said developer.

5. A method according to claim 4, wherein said photosensitive thin film is an organic photosensitive layer composed of an organic charge generating layer and an organic charge transfer layer, and said organic charge generating layer and organic charge transfer layer each have a film thickness of the least 0.04 $\mu$m.

6. A method according to claim 5, wherein that said organic charge generating layer is formed as a film using a coating liquid wherein an organic charge generating agent is dispersed in a butyral resin, and said organic charge transfer layer is formed as a film using a coating liquid wherein a hole transferring organic compound is dispersed in a polycarbonate resin.

7. A method according to claim 1, wherein that said photosensitive thin film is an organic photosensitive layer composed of an organic charge generating layer and an organic charge transfer layer, and said organic charge generating layer and said organic charge transfer layer each have a film thickness of the least 0.04 $\mu$m.

8. A method according to claim 7, wherein that said organic charge generating layer is formed as a film using a coating liquid wherein an organic charge generating agent is dispersed in a butyral resin, and said organic charge transfer layer is formed as a film using a coating liquid wherein a hole transferring organic compound is dispersed in a polycarbonate resin.

9. A method according to claim 1, wherein said development is performed by non-contact development, wherein said photosensitive thin film and developer carrier are separated by a distance of approximately 100 to 300 $\mu$m.

10. A method whereby a pixel light emitting layer and pixel electrodes for each color are formed so as to be separated from one another in a color organic EL panel wherein an organic light emitting material is layered between a pair of opposing electrodes, at least one of which is transparent or semitransparent, being said method comprising:

a transparent substrate being prepared wherein a transparent or semitransparent common electrode is formed on at least one face thereof;

a photosensitive thin film having a charge generating layer and charge transfer layer being formed on said common electrode;

said photosensitive thin film being uniformly charged, an electrostatic latent image being formed by exposure in a pattern in a first color among the three colors of red, green, and blue;

the exposed portion or the unexposed portion of said photosensitive film being developed using a powder developer, and a first mask, which is composed of said powder developer that has been charged and covers the regions other than the pixel region of said first color, being formed;

a first laminate of a light emitting layer of said first color, an electron transporting layer, and a pixel electrode layer being deposited uniformly in that order;

after deposition, said powder developer used in said first mask being transferred using the charge of the electrostatic latent image, the first laminate being selectively removed together therewith, and a pixel light emitting layer and pixel electrode of a pixel pattern of said first color being formed;

said photosensitive thin film being uniformly charged, an electrostatic latent image being formed by exposure in a pattern in a second color among the three colors of red, green, and blue;

the exposed portion or the unexposed portion of said photosensitive film being developed using a powder developer, and a second mask, which is composed of said powder developer that has been charged and covers the regions other than the pixel region of said second color, being formed;

a second laminate of a light emitting layer of said second color, an electron transporting layer, and a pixel electrode layer being deposited uniformly in that order;

after deposition, said powder developer used in said second mask being transferred using the charge of the electrostatic latent image, the second laminate being selectively removed together therewith, and a pixel light emitting layer and pixel electrode of a pixel pattern of said second color being formed;

said photosensitive thin film being uniformly charged, an electrostatic latent image being formed by exposure in a pattern in a third color among the three colors of red, green, and blue;

the exposed portion or the unexposed portion of said photosensitive film being developed using a powder developer, and a third mask, which is composed of said powder developer that has been charged and covers the regions other than the pixel region of said third color, being formed;

a third laminate of a light emitting layer of said third color, an electron transporting layer, and a pixel electrode layer being deposited uniformly in that order; and after deposition, said powder developer used in said third mask being transferred using the charge of the electrostatic latent image, the third laminate being selectively removed together therewith, and a pixel light emitting layer and pixel electrode of a pixel pattern of said third color being formed;

selective removal of the first laminate, the second laminate, and the third laminate causing a pixel light emitting layer and pixel electrodes to be formed in the three colors of red, green, and blue in the respective desired pixel patterns.

11. A method according to claim 10, wherein said first, second and third laminates of a light emitting layer, electron transporting layer, and pixel electrode layer are formed by the uniform vapor deposition of a light emitting layer, electron transporting layer, and pixel electrode layer in that order by in vacuo vapor deposition.

12. A method according to claim 10, wherein said development is performed using a powder developer having a granule size of about 6 $\mu$m.

13. A method. according to claim 10, wherein a pulverized developer obtained by kneading a charge control agent into a polymer selected from the group consisting of polyesters, styrene-acrylic copolymers, and acrylics, and pulverized to a suitable granule size, or a polymerized developer, produced by incorporating said charge control agent when said polymer is polymerized and inducing polymerization to a suitable granule size, is used as said developer.

14. A method according to claim 13, wherein that said photosensitive thin film is an organic photosensitive layer composed of an organic charge generating layer and an organic charge transfer layer, and said organic charge generating layer and organic charge transfer layer each have a film thickness of the least 0.04 $\mu$m.

15. A method according to claim 14, wherein said organic charge generating layer is formed as a film using a coating liquid wherein an organic charge generating agent is dispersed in a butyral resin, and said organic charge transfer layer is formed as a film using a coating liquid wherein a hole transferring organic compound is dispersed in a polycarbonate resin.

16. A method according to claim 10, wherein said photosensitive thin film is an organic photosensitive layer composed of an organic charge generating layer and an organic charge transfer layer, and said organic charge generating layer and said organic charge transfer layer each have a film thickness of at least 0.04 $\mu$m.

17. A method according to claim 16, wherein said organic charge generating layer is formed as a film using a coating liquid wherein an organic charge generating agent is dispersed in a butyral resin, and said organic charge transfer layer is formed as a film using a coating liquid wherein a. hole transferring organic compound is dispersed in a polycarbonate resin. coating liquid wherein a hole transferring compound is dispersed in a polycarbonate resin.

18. A method according to claim 10, wherein said development is performed by non-contact development, wherein said photosensitive thin film and a developer carrier are separated by a distance of approximately 100 to 300 $\mu$m.

* * * * *